(12) United States Patent
Matsuoka et al.

(10) Patent No.: US 8,174,920 B2
(45) Date of Patent: May 8, 2012

(54) SEMICONDUCTOR MEMORY DEVICE AND DRIVING METHOD OF THE SAME

(75) Inventors: Fumiyoshi Matsuoka, Kawasaki (JP); Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 233 days.

(21) Appl. No.: 12/711,613

(22) Filed: Feb. 24, 2010

(65) Prior Publication Data

US 2010/0238740 A1    Sep. 23, 2010

(30) Foreign Application Priority Data

Mar. 17, 2009    (JP) ................. 2009-064214

(51) Int. Cl.
*G11C 7/02*    (2006.01)
*G11C 11/24*   (2006.01)
(52) U.S. Cl. ........................ 365/207; 365/149
(58) Field of Classification Search .............. 365/207, 365/149, 189.05, 205
See application file for complete search history.

(56) References Cited

U.S. PATENT DOCUMENTS

| | | | |
|---|---|---|---|
| 6,621,725 B2 | 9/2003 | Ohsawa | |
| 7,061,806 B2 * | 6/2006 | Tang et al. | 365/185.18 |
| 7,184,298 B2 * | 2/2007 | Fazan et al. | 365/149 |
| 7,539,069 B2 | 5/2009 | Fujita | |
| 7,619,928 B2 * | 11/2009 | Park et al. | 365/185.18 |
| 2007/0127289 A1 * | 6/2007 | Lee | 365/182 |
| 2010/0177573 A1 | 7/2010 | Matsuoka et al. | |

FOREIGN PATENT DOCUMENTS

| | | |
|---|---|---|
| JP | 2007-323700 | 12/2007 |
| JP | 2010-160865 | 7/2010 |

OTHER PUBLICATIONS

U.S. Appl. No. 12/684,674, filed Jan. 8, 2010.

* cited by examiner

*Primary Examiner* — Anh Phung
(74) *Attorney, Agent, or Firm* — Oblon, Spivak, McClelland, Maier & Neustadt, L.L.P.

(57) ABSTRACT

A memory includes a first and a second bit lines (BL); a first and a second sense nodes (SN); a first transfer gate between the $1^{st}$-BL and the $1^{st}$-SN; a second transfer gate (TG) between the $2^{nd}$-BL and the $2^{nd}$-SN; a latch circuit latching data to the $1^{st}$ and $2^{nd}$-SN; a first data line (DQ) from the $1^{st}$-SN to outside; and a $2^{nd}$-DQ from the $2^{nd}$-SN to outside, wherein write data is transmitted from the $1^{st}$ and $2^{nd}$-DQ to the $1^{st}$ and $2^{nd}$-SN corresponding to selected cells before the $1^{st}$ and $2^{nd}$-TG are set to be a conductive state, when writing data into the selected cells to be written out of the cells, and write data in the $1^{st}$ and $2^{nd}$-SN corresponding to the selected cells are started to be written into the selected cells, when the $1^{st}$ and $2^{nd}$-TG are set to be a conductive state.

20 Claims, 14 Drawing Sheets

SEMICONDUCTOR MEMORY DEVICE AND DRIVING METHOD OF THE SAME

CROSS-REFERENCE TO RELATED APPLICATION

This application is based upon and claims the benefit of priority from the prior Japanese Patent Applications No. 2009-64214, filed on Mar. 17, 2009, the entire contents of which are incorporated herein by reference.

BACKGROUND OF THE INVENTION

1. Field of the Invention

The present invention relates to a semiconductor memory device and a driving method of a semiconductor memory device.

2. Related Art

In recent years, FBC (Floating Body Cell) memory device is available as a type of semiconductor memory device expected as a memory alternative to 1T (Transistor)-1C (Capacitor) DRAM. The FBC memory device has an FET (Field Effect Transistor) including a floating body (hereinafter, also "body") formed on an SOI (Silicon On Insulator) substrate, and stores data "1" or data "0" based on the number of majority carriers accumulated in the body.

According to a conventional FBC memory, in a data write operation during t1 and t2 (see FIG. 9), a sense amplifier once detects data within memory cells of all columns (an initial sense operation), and latches the detected data. During t3 and t5, only latched data in a selected column to be written is overwritten with external data. On the other hand, data in unselected columns not to be written is latched to a sense node in a state of the detected data. Thereafter, the sense amplifier writes (writes back) data in all columns to the memory cells.

However, in the selected column, a column select line is activated and data is transmitted from a DQ line to the sense node, after the initial sense operation. Therefore, the time of writing data into the selected memory cells becomes substantially short, in a constant write cycle time. Meanwhile, a write cycle has to be longer when a sufficient write time is attempted to be secured.

SUMMARY OF THE INVENTION

A semiconductor memory device according to an embodiment of the present invention comprises: a plurality of memory cells respectively comprising a body in an electrically floating state and configured to store data based on number of carriers within the body; word lines configured to function as gates of the memory cells; a first bit line and a second bit line configured to transmit data to the memory cells or from the memory cells; a first sense node and a second sense node corresponding to the first bit line and the second bit line, respectively; a first transfer gate connected between the first bit line and the first sense node; a second transfer gate connected between the second bit line and the second sense node; a latch circuit configured to latch data from the first bit line to the first sense node, and to latch data from the second bit line to the second sense node; a first data line configured to read data latched to the first sense node to outside, or to transmit data from outside to the first sense node; and a second data line configured to read data latched to the second sense node to outside, or to transmit data from outside to the second sense node, wherein write data is transmitted from the first and second data lines to the first and second sense nodes corresponding to selected memory cells before the first and second transfer gates are set to be a conductive state, when writing data into the selected memory cells to be written out of the memory cells, and write data in the first and second sense nodes corresponding to the selected memory cells are started to be written into the selected memory cells, when the first and second transfer gates are set to be a conductive state.

A driving method of a semiconductor device according to an embodiment of the present invention, the semiconductor device comprising a plurality of memory cells respectively comprising a body in an electrically floating state and configured to store data based on number of carriers within the body, a first bit line and a second bit line connected to the memory cells, a first sense node and a second sense node corresponding to the first and second bit lines, respectively, a first transfer gate connected between the first bit line and the first sense node, and a second transfer gate connected between the second bit line and the second sense node, wherein write data is transmitted from the first and second data lines to the first and second sense nodes corresponding to selected memory cells before the first and second transfer gates are set to be a conductive state, when writing data into the selected memory cells to be written out of the memory cells, and write data in the first and second sense nodes corresponding to the selected memory cells are started to be written into the selected memory cells, when the first and second transfer gates are set to be a conductive state.

A semiconductor memory device according to an embodiment of the present invention comprises: a plurality of memory cells respectively comprising a body in an electrically floating state and configured to store data based on number of carriers within the body; word lines configured to function as gates of the memory cells; a first bit line and a second bit line configured to transmit data to the memory cells or from the memory cells; a first sense node and a second sense node corresponding to the first bit line and the second bit line, respectively; a first transfer gate connected between the first bit line and the first sense node; a second transfer gate connected between the second bit line and the second sense node; a latch circuit configured to latch data from the first bit line to the first sense node, and to latch data from the second bit line to the second sense node; a first data line configured to read data latched to the first sense node to outside, or to transmit data from outside to the first sense node; and a second data line configured to read data latched to the second sense node to outside, or to transmit data from outside to the second sense node, wherein the first bit line transfers an information data from the selected memory cells, the second bit line transfers a reference data used for detecting logic of the information data, the latch circuit latches the information data to the first sense node and latches an opposite logic data of the information data to the second sense node, write data is transmitted from the first and second data lines to the first and second sense nodes corresponding to a selected memory cells before the first and second transfer gates are set to be a conductive state, when writing data into a selected memory cell to be written out of the memory cell, and write data in the first node corresponding to the selected memory cell is started to be written into the selected memory cell, when the first transfer gate is set to be a conductive state.

DETAILED DESCRIPTION OF THE INVENTION

Embodiments of the present invention will be explained below in detail with reference to the accompanying drawings. Note that the invention is not limited thereto.

(First Embodiment)

Figure 1:
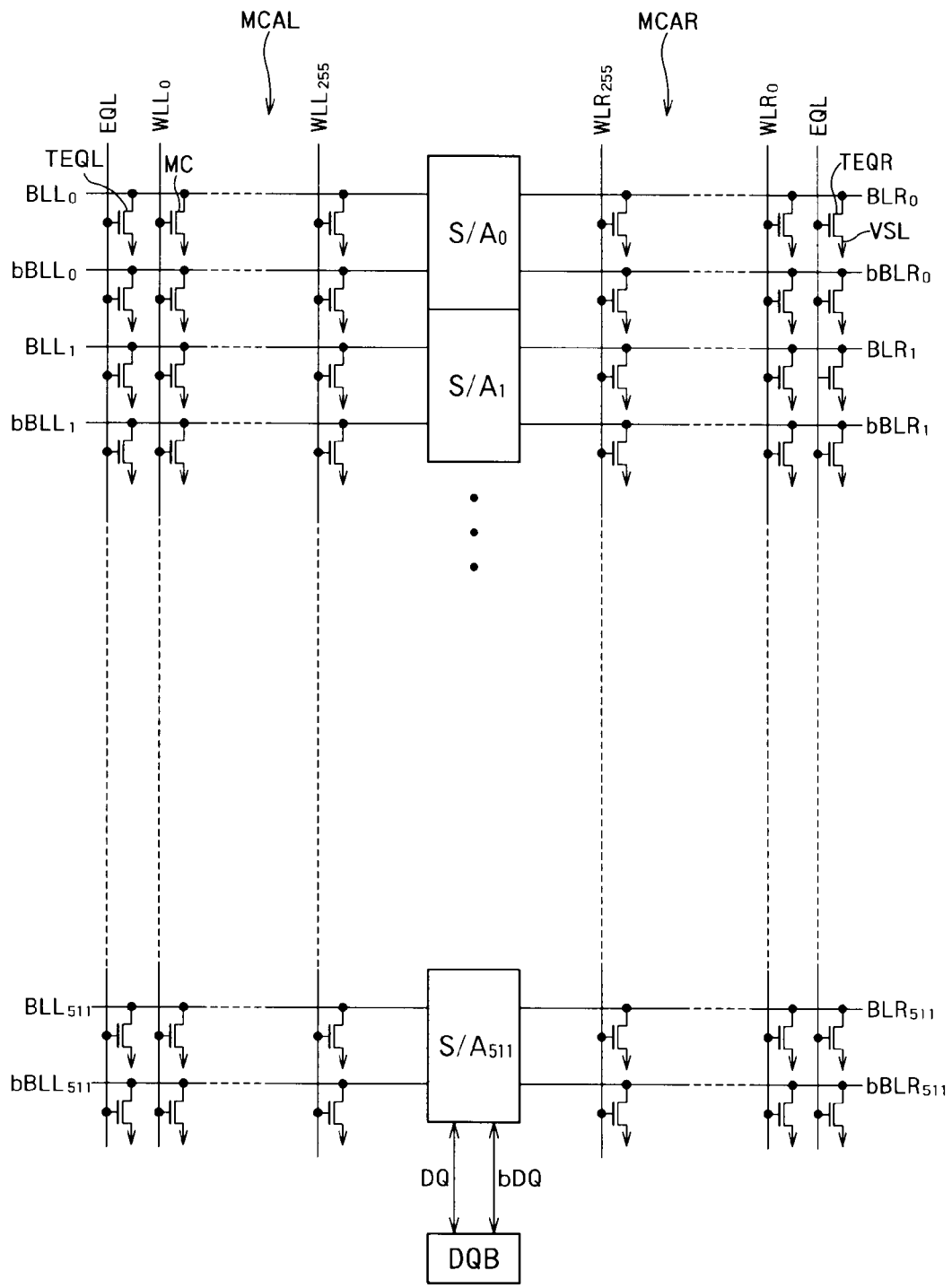
FIG. 1 is a circuit diagram showing a configuration of an FBC memory device according to a first embodiment of the present invention.

FIG. 1 is a circuit diagram showing a configuration of an FBC memory device according to a first embodiment of the present invention. An FBC memory includes memory cells MC, sense amplifiers S/Ai (i is an integer) (hereinafter, also "S/A"), word lines WLLi and WLRi (hereinafter, also "WLL and WLR"), bit lines BLLi and BLRi (hereinafter, also "BLL and BLR"), bit lines bBLLi and bBLRi (hereinafter, also "bBLL and bBLR"), equalizing lines EQL, and equalizing transistors TEQL and TEQR (hereinafter, also "TEQ").

The FBC memory according to the first embodiment employs a two-cell/bit system. The two-cell/bit system is an operation system of storing one-bit data into two memory cells MC connected to a bit line pair BLL and bBLL or a bit line pair BLR and bBLR and adjacent on the same word line, by writing data of mutually opposite polarities into the two memory cells MC. The data of opposite polarities is data having a complementary relation such as a relation between data "0" and data "1". In reading data, one of the data of opposite polarities is set as a reference of the other data, and the other data is set as a reference of the one data. Therefore, data of mutually opposite polarities are transmitted through the bit line pair BLL and bBLL or the bit line pair BLR and bBLR. In the first embodiment, the bit line BLL or BLR is referred to as a first bit line, and the bit line bBLL or bBLR is referred to as a second bit line.

The memory cells MC are configured by N-type FETs. The memory cells MC are arranged in a matrix shape, thereby constituting memory cell arrays MCAL and MCAR (hereinafter, also "MCA"). The word lines WLL and WLR are extended to a row direction, and are connected to gates of the memory cells MC. In the first embodiment, 256 word lines WLL and WLR are provided, respectively at left and right sides of the sense amplifiers S/A (WLL0 to WLL255 and WLR0 to WLR255). The bit lines BLL and BLR are extended to a column direction, and are connected to a source or a drain of the memory cells MC. Also, 512 bit lines BLL and BLR are provided, respectively at left and right sides of the sense amplifiers S/A (BLL0 to BLL511 and BLR0 to BLR511). The word lines and the bit lines are orthogonal with each other, and the memory cells MC are provided at intersections of these lines. Names of the row direction and the column direction are used for the sake of convenience, and can be replaced with each other.

The equalizing lines EQL are connected to gates of the equalizing transistors TEQ. The equalizing transistors TEQ are connected between the bit lines BLL and BLR and source potential VSL. In the equalizing, the bit lines BLL and BLR are connected to the source potential VSL, thereby equalizing potentials of the bit lines BLL and BLR.

The sense amplifiers S/A are connected to the bit lines BL and bBL, and are configured to detect data stored in a selected memory cell MC or write data into a selected memory cell MC.

In a data read operation, data latched by the sense amplifiers S/A are transmitted to a DQ buffer DQB via data lines DQ and bDQ. Data stored in the DQ buffer DQB are read to the outside. In a data write operation, data from the outside are stored in the DQ buffer DQB. The data are transmitted to the sense amplifiers S/A via the data lines DQ and bDQ. Since a conventional DQ buffer can be used as the DQ buffer DQB, and thus explanations thereof will be omitted herein.

Figure 2:
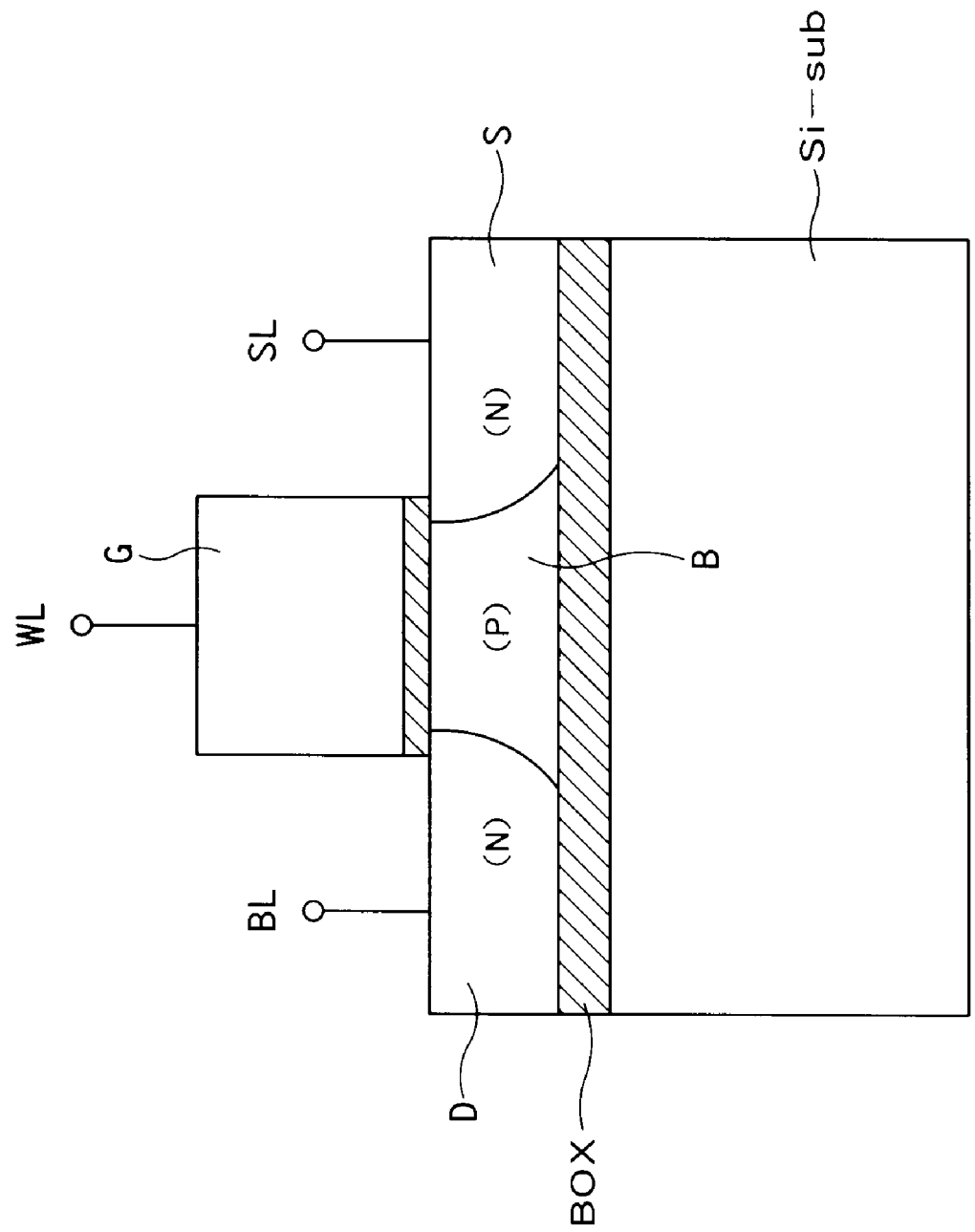
FIG. 2 is a cross-sectional view of an FBC.

FIG. 2 is a cross-sectional view of an FBC (Floating Body Cell). The FBC memory is configured by an FET (Field Effect Transistor) including a floating body (hereinafter, also "body") formed on an SOI (Silicon On Insulator) substrate, and stores data "1" or data "0" based on the number of majority carriers accumulated in the body. It is defined that a state in which the number of holes (majority carriers) in the body is small is data "0" and that a state in which the number of holes in the body is large is data "1". Accordingly, if memory cells MC are N-FETs, the memory cells MC storing data "1" therein have a lower threshold voltage than that of the memory cells MC storing data "0" therein, and higher current is applied to the memory cells MC storing data "1" therein.

Figure 3:
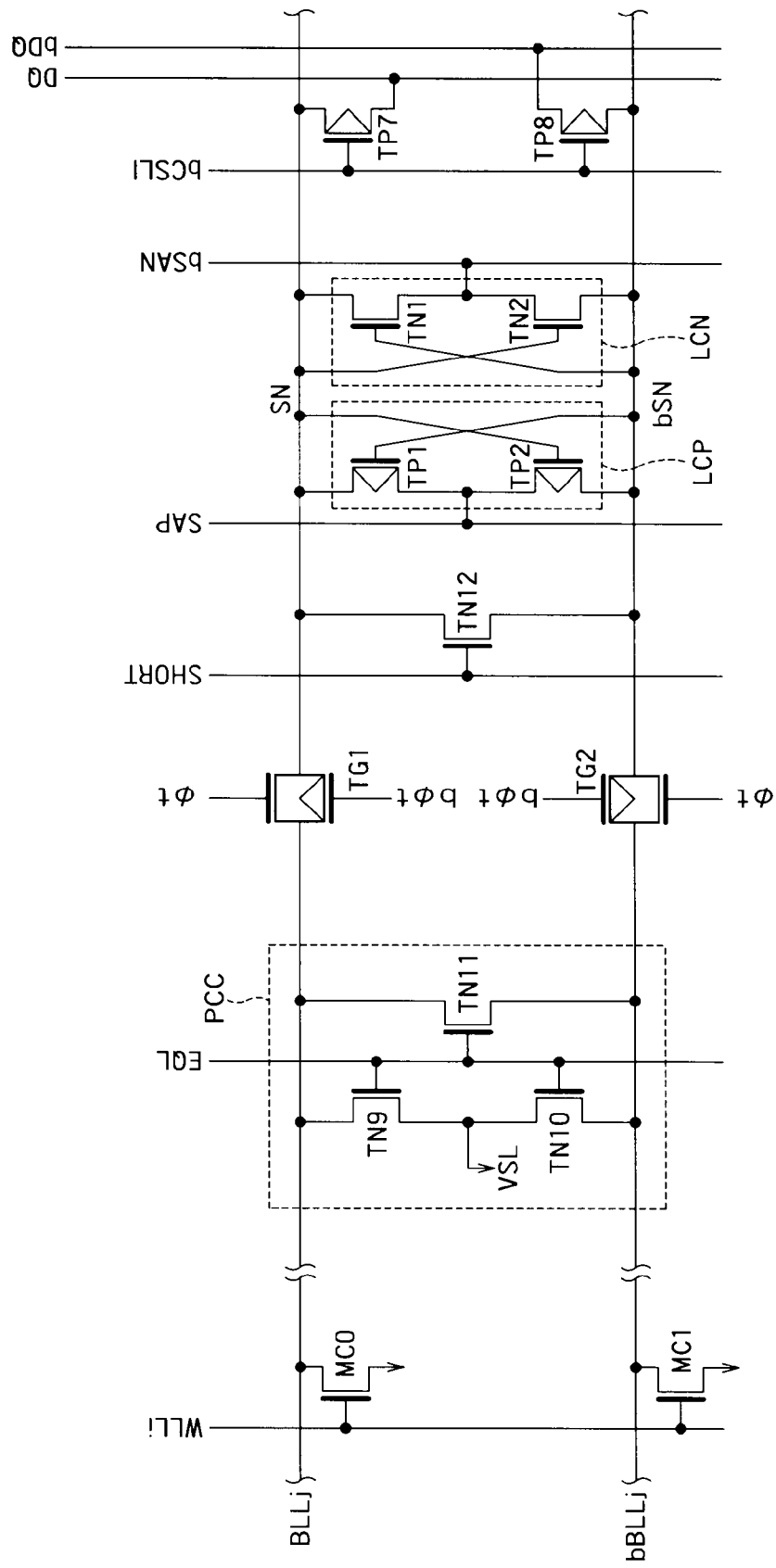
FIG. 3 is a circuit diagram showing a configuration of a sense amplifier S/A and a periphery thereof according to the first embodiment.

FIG. 3 is a circuit diagram showing a configuration of a sense amplifier S/A and a periphery thereof according to the first embodiment. The sense amplifier S/A in FIG. 3 shows a structure connected to bit lines BLL at a memory cell array MCAL side. The sense amplifier S/A is also connected to bit lines BLR at a memory cell array MCAR side via a transfer gate. These bit lines are omitted from FIG. 3.

A pair of bit lines BLLj (j is an integer) and bBLLj are connected to corresponding sense nodes SN and bSN, respectively, via transfer gates TG1 and TG2. The transfer gates TG1 and TG2 are on/off controlled by signals Φt and bΦt. The signals Φt and bΦt are common signals to the selected and the unselected columns. A CMOS (Complementary MOS) is used for the transfer gates TG1 and TG2. The sense amplifier S/A includes a sense node pair SN and bSN. The sense amplifier S/A also includes latch circuits LCP and LCN. A P-type latch circuit LCP includes two P-type transistors TP1 and TP2 connected in series between the sense nodes SN and bSN. A gate of the transistor TP1 is connected to the sense node bSN, and a gate of the transistor TP2 is connected to the sense node SN. That is, the gates of the transistors TP1 and TP2 are cross-coupled to the sense nodes SN and bSN.

Similarly, in an N-type latch circuit LCN, gates of N-type transistors TN1 and TN2 are cross-coupled to the sense nodes SN and bSN. The latch circuits LCP and LCN are driven by signals SAP and bSAN, respectively.

The N-type latch circuit LCN supplies a low level potential VSS lower than the source potential VSL of the memory cell MC to either the sense node SN or bSN. The P-type latch circuit LCP supplies a high level potential VBLH higher than the source potential VSL to the other one of the sense node SN or bSN.

A P-type transistor TP7 is connected between the data line DQ and the sense node SN. A P-type transistor TP8 is connected between the data line bDQ and the sense node bSN. Gates of the transistors TP7 and TP8 are connected to a column select line bCSL. The column select line bCSL is selectively activated to low when reading data to the outside or writing data from the outside. With this arrangement, the sense nodes SN and bSN are connected to the DQ buffer DQB via the data lines DQ and bDQ, respectively. The data lines DQ and bDQ read data latched to the sense nodes SN and bSN, to the outside, or transmit data from the outside to the sense nodes SN and bSN.

The latch circuits LCP and LCN latch data from the bit line BLLj to the sense node SN, and latch data from the bit line bBLLj to the sense node bSN. The latch circuits LCP and LCN latch data from the data line DQ to the sense node SN, and latch data from the data line bDQ to the sense node bSN.

A short-circuiting transistor TN12 is controlled by a signal SHORT. The short-circuiting transistor TN12 maintains the sense nodes SN and bSN at the same potential in a precharge period, and disconnects the sense node SN and bSN from each other in a read operation or a write operation. In the first embodiment, the signal bSAN is always in an active state, and the sense nodes SN and bSN are connected to the low level potential VSS via the N-type latch circuit LCN. However, when the signal bSAN is active and also when the signal SAP is inactive, potentials of the sense nodes SN and bSN decrease to only about VSS+Vthn (Vthn is a threshold voltage of the transistors TN1 and TN2). When detecting data, the sense amplifier S/A develops the potentials of the sense nodes SA and bSN from VSS+Vthn.

A precharge circuit PCC is connected between the bit lines BLLj and bBLLj. The precharge circuit PCC includes N-type transistors TN9 and TN10 connected in series between the bit lines BLLj and bBLLj, and an N-type transistor TN11 connected between the bit lines BLLj and bBLLj. A node between the N-type transistors TN9 and TN10 is connected to the source potential VSL.

The precharge circuit PCC connects the bit lines BLLj and bBLLj to the source potential VSL in a precharge period. With this arrangement, the bit lines BLLj and bBLLj are charged to the source potential VSL in a precharge period.

Figure 4:
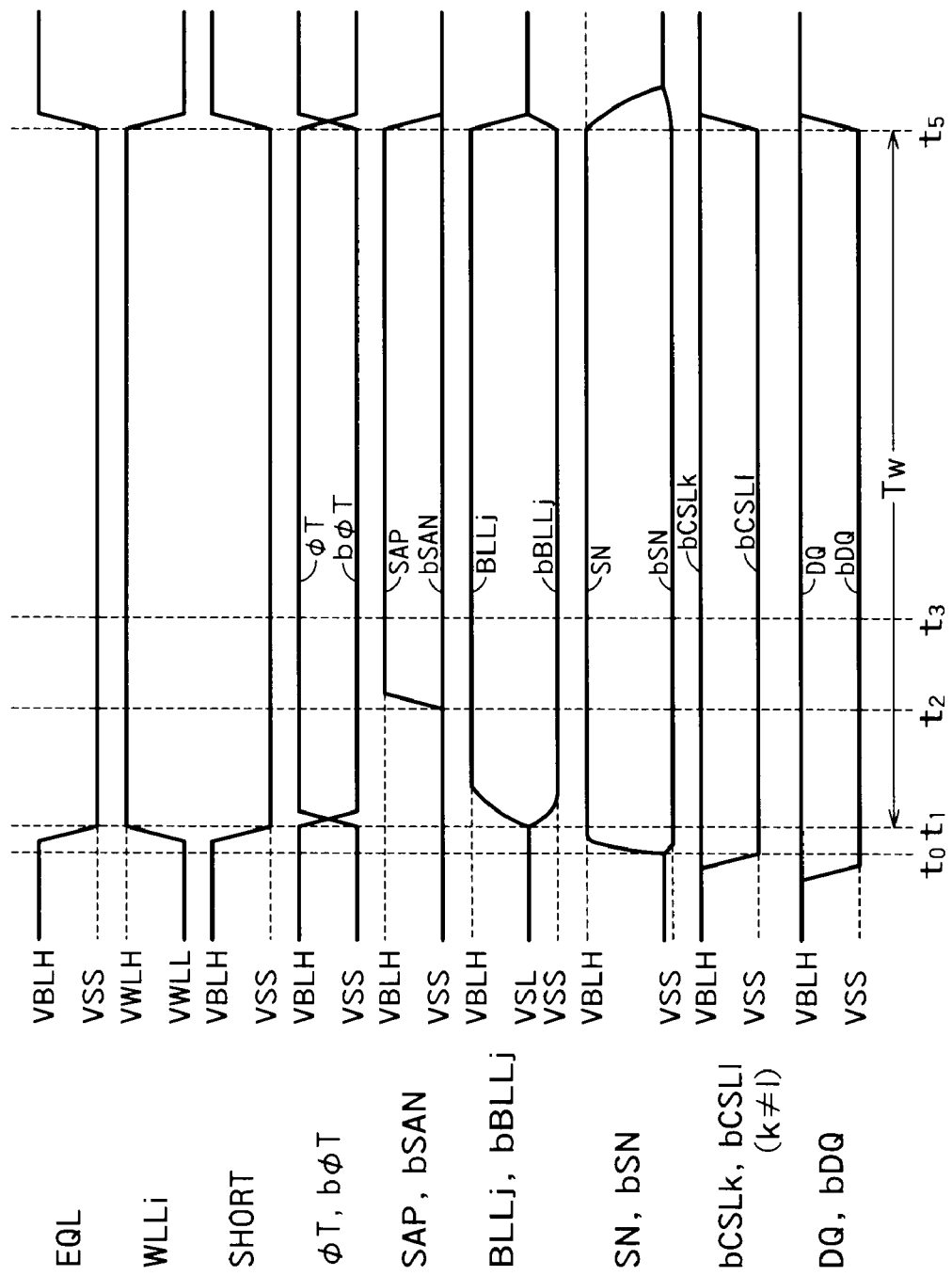
FIG. 4 is a timing diagram showing a data write operation of the FBC memory according to the first embodiment.

FIG. 4 is a timing diagram showing a data write operation of the FBC memory according to the first embodiment. At the beginning, a memory cell MC0 within the memory cell array MCAL shown in FIG. 3 is assumed to store data "0", and a memory cell MC1 is assumed to store data "1". In a write operation, data "1" is assumed to be written into the memory cell MC0, and data "0" is assumed to be written into the memory cell MC1. The sense amplifiers S/A in unselected columns restore detected data in unselected memory cells MC that are non-write targets among the memory cells MC connected to a selected word line WLLi, in logical states as they are.

The operation of the memory cell array MCAR can be easily assumed the operation of the memory cell array MCAL, and thus explanations thereof will be omitted. In a write operation, data "0" is written into the memory cell MC0, and data "1" is written into the memory cell MC1. This operation can be easily assumed by the following detailed example, and thus explanations thereof will be omitted.

To write the data "0" to the memory cell MC1, holes accumulated in the body B are withdrawn to the bit line bBLj using a forward bias between the body B and a drain of the memory cell MC1. To write the data "1" to the memory cell MC0, a high-level voltage VWLH of the word line WLLi and the high-level voltage VBLH of the bit line BLj cause impact ionization, thereby accumulating holes in the body B of the memory cell MC1.

The data write cycle includes a data detection operation and a data write operation (or a restore operation). A data write period in this case does not include a data detection period, but is only a period of writing data.

In a precharge state (up to t0), signals EQL and SHORT are in an active state. The bit lines BL and bBL are fixed to the same potential (near VSL). The transistors TN1, TN2 and TN12 fix the sense nodes SN and bSN to the same potential (near VSS).

In this specification, "activate" means to turn on or drive an element or a circuit, and "inactivate" means to turn off or suspend drive of an element or a circuit. Therefore, a HIGH (high potential level) signal can be an activation signal, and a LOW (low potential level) signal can be an activation signal. For example, an NMOS transistor is activated by setting a gate to HIGH. On the other hand, a PMOS transistor is activated by setting a gate to LOW.

In a precharge period before t0, the data lines DQ and bDQ of a selected column to be written transmit the write data. For example, as shown in FIG. 4, the data line DQ transmits the high level potential VBLH, and the data line bDQ transmits the low level potential VSS. VBLH is a voltage to be applied to a bit line at the time of writing data "1" into a memory cell MC. VSS is a voltage to be applied to a bit line at the time of writing data "0" into a memory cell MC.

Furthermore, at t0, a column select line bCSL corresponding to a selected column is activated to a low level. Accordingly, the transistors TP7 and TP8 in FIG. 3 become activated. As a result, data in the data lines DQ and bDQ of the selected column are transmitted to the sense nodes SN and bSN of the selected column, respectively. That is, at t1, before the transfer gates TG1 and TG2 are in a conductive state, write data is transmitted to the sense nodes SN and bSN of the selected column. The latch circuits LCP and LCN latch the write data to the sense nodes SN and bSN, respectively. In the first embodiment, the latch circuits LCP and LCN latch the high level potential VBLH to the sense node SN, and latches the low level potential VSS to the sense node bSN.

A P-type transistor can usually sufficiently transmit a high level potential, but transmits a low level potential higher by the threshold voltage. Therefore, the P-type transistor TP8 transmits the low level potential higher than VSS by the threshold voltage of the P-type transistor TP8, (VSS+Vtp8). However, in the first embodiment, because the signal bSAN is always in an active state (the low level potential VSS), the N-type transistor TN2 in the latch circuit LCN supplies VSS to the sense node bSN. As a result, the latch circuit LCN can latch the low level potential VSS to the sense node bSN.

At t1, the signals EQL and SHORT are in an inactive state. Accordingly, the bit line BL is disconnected from bBL, and the sense node SN is disconnected from bSN. At the same time, a word line WLLi (i is an integer) of a selected row to be written is selectively activated. Other unselected word lines WL are maintained in a data holding state (VWLL).

At t1, a signal ΦT is activated to a high level. Accordingly, the transfer gates TG1 and TG2 of all columns become a conductive state, and a pair of bit lines BL and bBL of all columns are connected to a corresponding pair of sense nodes SN and bSN, respectively. As a result, the bit lines BLLj and bBLLj of the selected column to be written are connected to the sense nodes SN and bSN, respectively. Bit lines of unselected columns not to be written are connected to corresponding sense nodes, respectively. The transfer gates TG1 and TG2 also become a conductive state.

The signal bSAN is always in an active state. The latch circuit LCN is driven, and the low level voltage VSS is connected to the sense nodes SN and bSN. A load current flows to the sense nodes SN and bSN via the bit lines BLLj and bBLLj from sources of the memory cells MC0 and MC1. That is, in the first embodiment, during the data detection period, the latch circuit LCN supplies the low level potential VSS to the sense nodes SN and bSN, and the N-type transistors TN1 and TN2 pass a load current (an NMOS load).

Figure 9:
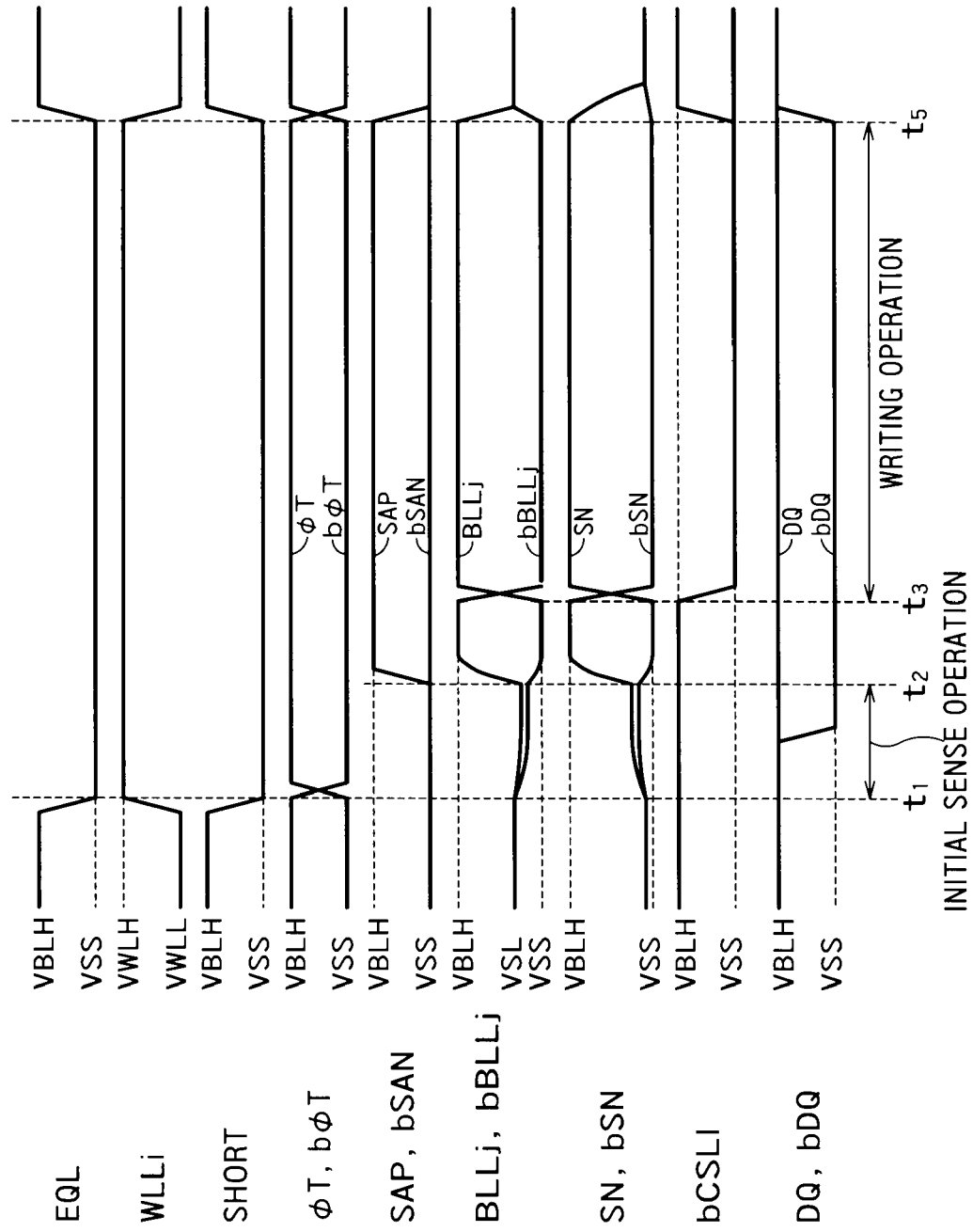
FIG. 9 is a timing diagram showing a data write operation of a conventional FBC memory.

During t1 to t2, in unselected columns, a potential difference (a signal difference) between data "1" and "0" is generated in between the sense nodes SN and bSN. FIG. 4 does not show a signal development of the sense node pair and the bit line pair of the unselected columns. The operation before t3 is same as that of the FIG. 9. At t2, when the signal difference is developed in a sufficiently large manner between the sense nodes SN and bSN, the signal SAP rises to the high level potential VBLH, and the latch circuit LCP in FIG. 3 is activated. The potential VBLH is connected to the sense node SN or bSN transmitting data "1", via the P-type transistor TP1 or TP2 in the latch circuit LCP. Because the latch circuit LCN is always in an active state, the potential VSS is connected to the sense node bSN or SN transmitting data "0", via the N-type transistor TN1 or TN2 in the latch circuit LCN. As a result, the sense amplifier S/A amplifies a signal difference to VBLH–VSS, and latches this signal difference to the sense nodes SN and bSN.

On the other hand, in a selected column, during t1 to t2, the bit lines BLLj and bBLLj are connected to the sense nodes SN and bSN, respectively. Accordingly, after t1, as shown in FIG. 4, potentials of the sense nodes SN and bSN are transmitted to the bit lines BLLj and bBLLj via the transfer gates TG1 and TG2, respectively. That is, in the first embodiment, from at the time when the transfer gates TG1 and TG2 are set to be a conductive state (after t1), the write data is started to be written into the memory cells MC of the selected column.

At t5, the data write cycle ends, and the FBC memory enters a precharge state.

Conventionally, in a selected column as well, the sense amplifier S/A once detects data of a selected memory cell MCj, overwrites this data with write data, and thereafter, performs a data write operation. As shown in a comparative example in FIG. 9, at t3, the column selected line bCSL is activated, and write data of the data lines DQ and bDQ are transmitted to the sense nodes SN and bSN. Therefore, the substantial data write time is about a period from t3 to t5.

On the other hand, in the first embodiment, a data write operation in a selected column is performed during a period Tw from t1 to t5, Therefore, even when a write cycle (t0 to t5) is constant, in the first embodiment, a data write period can be set longer than that in a conventional technique. When a data write period is constant, in the first embodiment, a write cycle time can be set shorter than that in a conventional technique, and the operation can be performed at a high speed.

In other words, according to the first embodiment, in an initial sense period (t1 to t2) when a sense amplifier S/A of unselected columns is detecting data, a sense amplifier S/A of a selected column has already started a data writing. Therefore, a write operation in the selected column is performed at a high speed.

During t1 to t2, a write operation is performed in selected bit lines BLLj and bBLLj, but the sense amplifier S/A is performing an initial sense operation in other unselected bit lines during t1 to t2, In this case, there is a risk that potentials of the selected bit lines BLLj and bBLLj give influence to potentials of unselected bit lines adjacent to the selected bit lines BLLj and bBLLj. This is due to a capacitance coupling between plural adjacent bit lines. However, because the FBC memory according to the first embodiment performs a sense operation by sensing the difference of currents that memory cells flow, the influence of disturbance due to a capacitance coupling between the adjacent bit lines is smaller than the influence of other memories such as a DRAM, performing a sense operation by sensing the difference of the stored charge. In the unselected column, the potential difference (signal difference) generated between the sense nodes SN and bSN can be larger by elongating the initial sensing term t1 to t2. Therefore, the restore operation term in the unselected column becomes short. However, since the same data which is originally stored in a cell is written again in the cell in restore operation, it is no problem for the restore term to be shorter than a term of the normal write operation.

(Second Embodiment)

Figure 5:
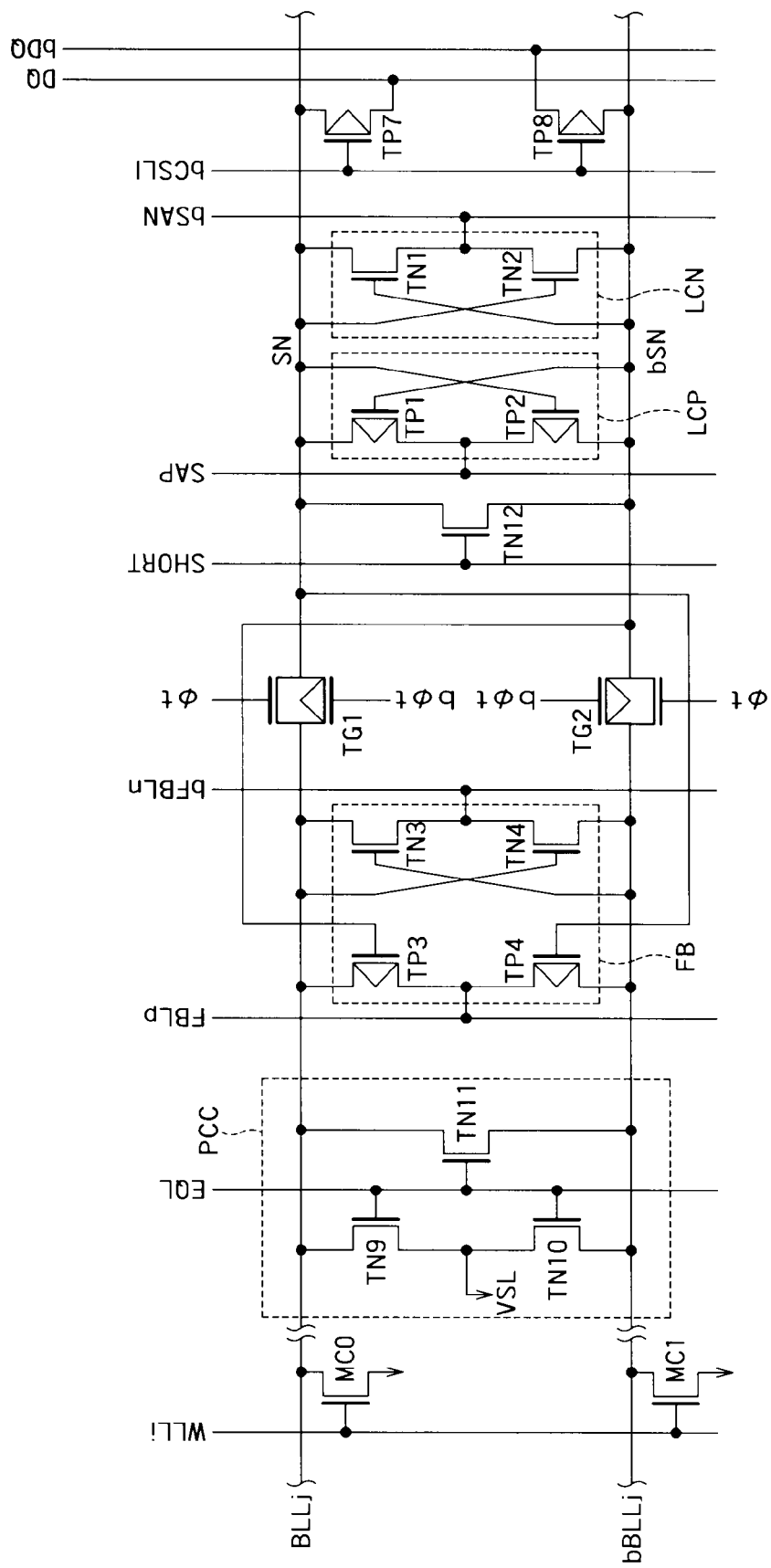
FIG. 5 is a circuit diagram showing a configuration of a sense amplifier S/A of an FBC memory according to a second embodiment of the present invention.

FIG. 5 is a circuit diagram showing a configuration of a sense amplifier S/A of an FBC memory according to a second embodiment of the present invention. The second embodiment is different from the first embodiment in that the FBC memory further includes a feedback circuit FB for writing. Other configurations of the second embodiment can be identical to those of the first embodiment.

The feedback circuit FB includes P-type transistors TP3 and TP4 connected in series between the bit lines BLLj and bBLLj, and N-type transistors TN3 and TN4 connected in series between the bit lines BLLj and bBLLj. Gates of the transistors TP3 and TP4 are connected to the sense nodes bSN and SN, respectively. That is, the gates of the transistors TP3 and TP4 are cross-coupled to the sense nodes SN and bSN. Gates of the transistors TN3 and TN4 are connected to the bit lines bBLLj and BLLj, respectively. That is, the gates of the transistors TN3 and TN4 are cross-coupled to the bit lines BLLj and bBLLj, respectively.

A node between the transistors TP3 and TP4 is connected to a feedback line FBLp. When the feedback line FBLp becomes at a high level potential, the feedback line FBLp is connected to either the bit line BLLj or bBLLj, according to potentials of the sense nodes SN and bSN. The feedback line FBLp is a common line to the selected columns and the unselected columns.

A node between the transistors TN3 and TN4 is connected to a feedback line bFBLn. When the feedback line bFBLn becomes at a low level potential, the feedback line bFBLn is connected to the other one of the bit line BLLj or bBLLj, according to a potential of the bit line BLLj or bBLLj. The feedback line bFBLn is a common line to the selected columns and the unselected columns.

That is, when data is written, the transistors TP3 and TP4 supply high level potentials to the bit line BLLj or bBLLj based on potentials of the sense nodes SN and bSN. Further, the transistors TN3 and TN4 supply low level potentials to the other one of the bit line BLLj or bBLLj, according to a bit line potential that has become a high level potential by the transistors TP3 and TP4. As a result, the feedback circuit FB can write data of mutually opposite polarities into the selected memory cells MC0 and MC1 according to the potential of the pair of sense nodes SN and bSN.

Figure 6:
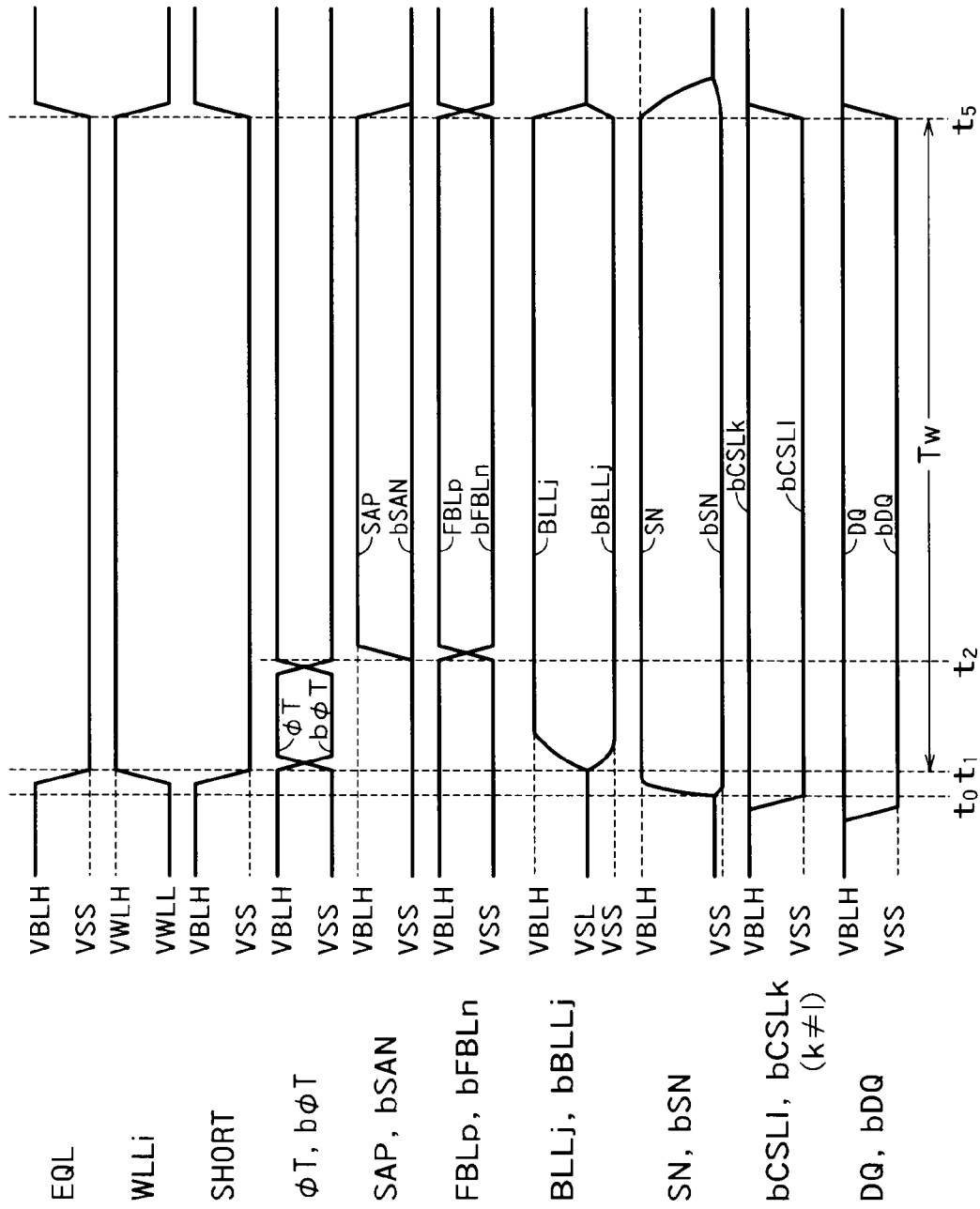
FIG. 6 is a timing diagram showing a data write operation of the FBC memory according to the second embodiment.

FIG. 6 is a timing diagram showing a data write operation of the FBC memory according to the second embodiment.

The memory cell MC0 stores data "0", and the memory cell MC1 stores data "1", in a similar manner to that in FIG. 4. In a write operation, data "1" is written into the memory cell MC0, and data "0" is written into the memory cell MC1.

The operation in the second embodiment up to immediately before t2 is identical to the operation in the first embodiment. During t1 to t2, sense amplifiers S/A detect data in memory cells MC in unselected columns (an initial sense operation). A write operation is already started in a selected column.

At t2, signals ΦT and bΦT are inactivated. Therefore, the transfer gates TG1 and TG2 become a nonconductive state, and the bit line pair BL and bBL is disconnected from the sense node pair SN and bSN after t2, Accordingly, in unselected columns, capacitance of the sense node pair SN and bSN is decreased. Signal amplification in the unselected columns is facilitated by decreasing the capacitance of the sense node pair SN and bSN.

On the other hand, in the selected column, the bit line pair BLLj and bBLLj is disconnected from the sense node pair SN and bSN and is in a floating state. During the write operation, currents flow through the memory cell MC0 and MC1. Therefore, when the bit line pair BLLj and bBLLj is disconnected from the sense node pair SN and bSN, the potential of the bit line pair BLLj and bBLLj cannot be maintained, causing insufficient data writing.

Therefore, after t2, the feedback circuit FB continues to write data into the memory cells MC0 and MC1. More specifically, at t2, the signal SAP is activated to a high level potential, and the feedback signals FBLp and bFBLn are activated. When the signal SAP is activated, the latch circuit LCP is driven. Because the sense node SN is at a high level and because the sense node bSN is at a low level, the high level potential VBLH is applied to the sense node SN via the P-type transistor TP1. Therefore, the write data transmitted from the data lines DQ and bDQ in the selected column is latched at the sense nodes SN and bSN by the latch circuits LCP and LCN. When the feedback signals FBLp and bFBLn are activated, the feedback circuit FB applies a potential based on write data to the bit line pair BLLj and bBLLj. That is, after the transfer gates TG1 and TG2 are set to be a nonconductive state, the feedback circuit FB writes write data into selected memory cells MC0 and MC1.

In the feedback circuit FB, the transistor TP3 becomes conductive by receiving the low level potential VSS of the sense node bSN, and applies the high level potential VBLH of the feedback signal FBLp to the bit line BLLj. Further, the transistor TN4 becomes conductive by receiving the high level potential VBLH of the bit line BLLj, and applies the low level potential VSS of the feedback signal bFBLn to the bit line bBLLj. The transistors TP4 and TN3 remain in a nonconductive state. Accordingly, the feedback circuit FB can write data "1" into the memory cell MC0 and write data "0" into the memory cell MC1.

Thereafter, at t5, the FBC memory enters a precharge state.

As explained above, in the second embodiment, in the initial sense period (t1 to t2) of the unselected columns, write data from the data lines DQ and bDQ are transmitted to the bit line pair BLLj and bBLLj via the sense node pair SN and bSN and the transfer gates TG1 and TG2, in the selected column. Thereafter, the signal SAP is activated after making the transfer gates TG1 and TG2 in a nonconductive state. While a signal amplification is started in the unselected columns (t2), the feedback circuit FB transmits the write data latched at the sense node pair SN and bSN to the bit line pair BLLj and bBLLj in the selected column. On the other hand, in the unselected columns, the feedback circuit FB operates a restore operation to the corresponding cells according to the amplified potential difference between the sense nodes SN and bSN.

According to the second embodiment, even when a transfer gates are set to be a nonconductive state in order to speed up the signal amplifying operation of unselected columns, the feedback circuit FB can continue writing write data into the selected memory cells MC0 and MC1 in a selected column. The second embodiment can also achieve effects identical to those of the first embodiment.

Figure 7:
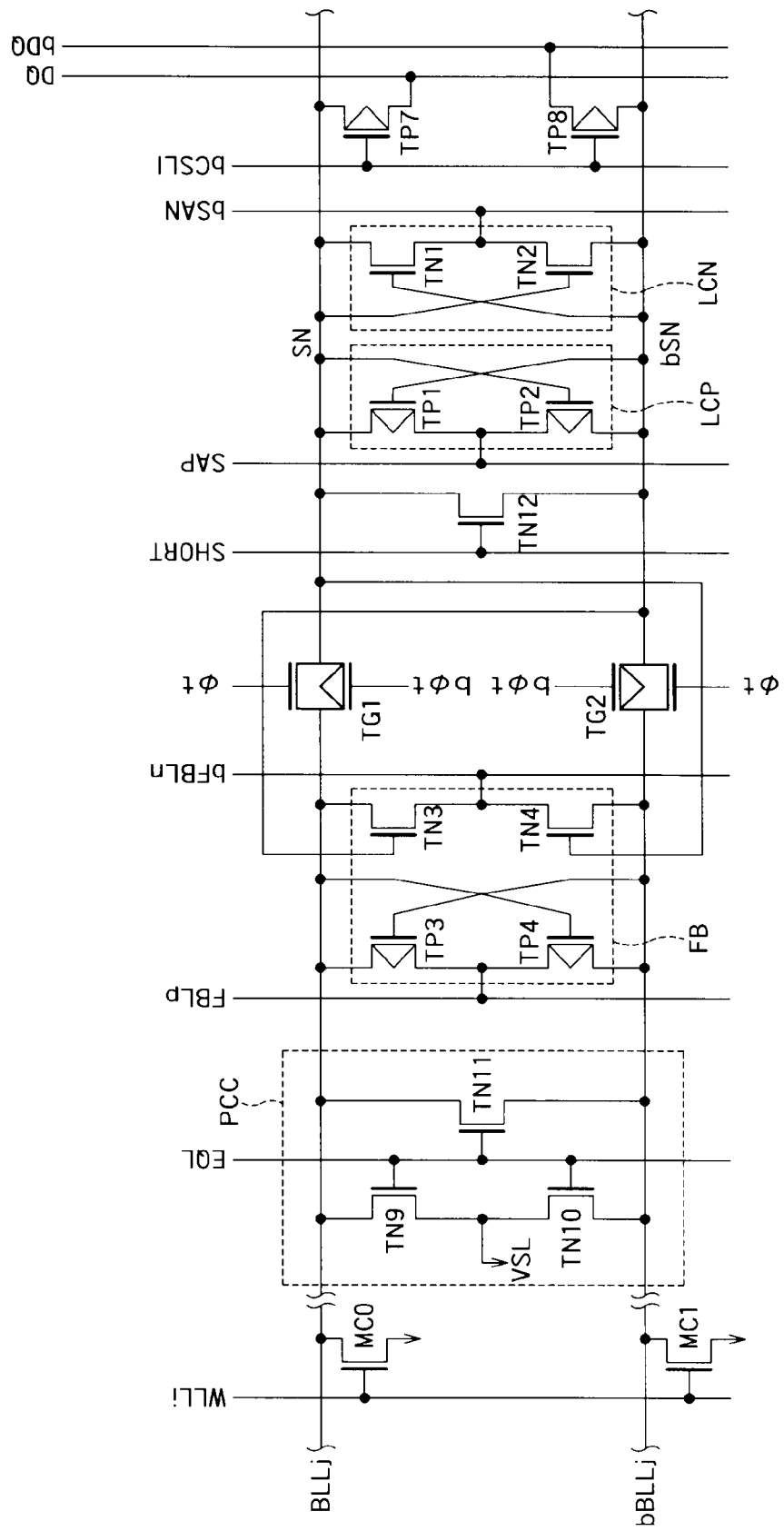
FIG. 7 and FIG. 8 are a circuit diagram showing sense amplifier S/A according to modifications of the second embodiment.
Figure 8:
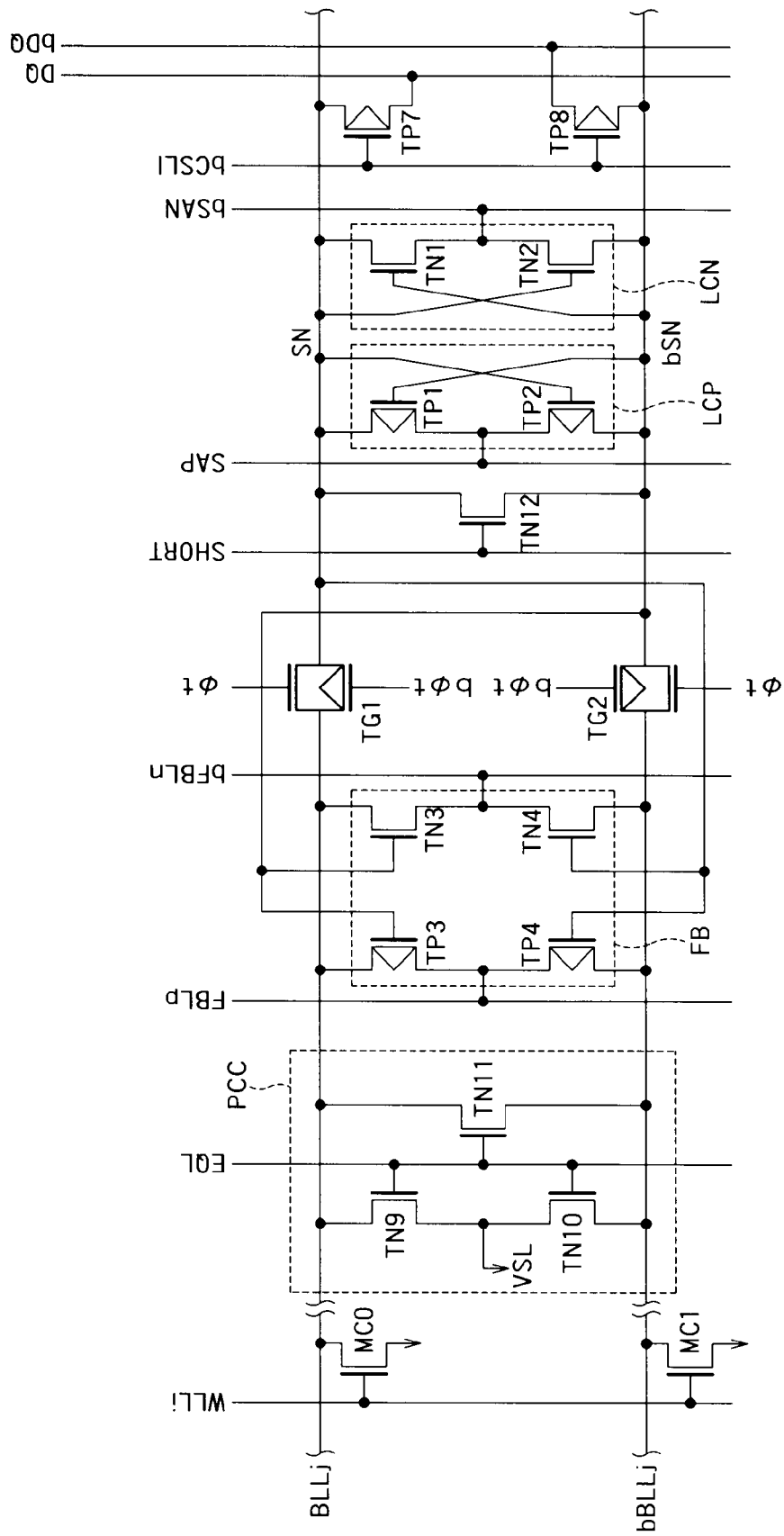

The sense amplifier S/A of the FBC memory according to the second embodiment can be modified as shown in FIG. 7 to FIG. 8.

In the sense amplifier S/A shown in FIG. 7, the gates of the N-type transistors TN3 and TN4 are connected to the sense nodes bSN and SN, respectively. The gates of the P-type transistors TP3 and TP4 are connected to the bit lines bBLLj and BLLj, respectively.

In a write operation, the transistors TN3 and TN4 supply the low level potential VSS to either the bit line BLLj or bBLLj, based on the potential of the sense nodes SN and bSN. Further, the transistors TP3 and TP4 supply the high level potential VBLH to the other one of the bit line BLLj or bBLLj, according to a bit line potential that has become the low level potential VSS by the transistors TN3 and TN4. As a result, the feedback circuit FB can write data of mutually opposite polarities into the selected memory cells MC0 and MC1 according to the potential of the pair of sense nodes SN and bSN. Other configurations and operations of the modification shown in FIG. 7 are identical to those of the second embodiment.

In a sense amplifier shown in FIG. 8, the gates of the N-type transistors TN3 and TN4 are connected to the sense nodes bSN and SN, respectively. The gates of the P-type transistors TP3 and TP4 are also connected to the sense nodes bSN and SN, respectively.

In a write operation, the transistors TN3 and TN4 supply the low level potential VSS to either the bit line BLLj or bBLLj, based on the potential of the sense nodes SN and bSN. Further, the transistors TP3 and TP4 supply the high level potential VBLH to the other one of the bit line BLLj or bBLLj, based on the potential of the sense nodes SN and bSN. As a result, the feedback circuit FB can write data of mutually opposite polarities into the selected memory cells MC0 and MC1 according to the potential of the pair of sense nodes SN and bSN. Other configurations and operations of the modification shown in FIG. 8 are identical to those of the second embodiment.

In the modifications shown in FIGS. 7 and 8, effects of the second embodiment can be achieved. However, as shown in FIG. 8, when all gates of the transistors TN3, TN4, TP3, and TP4 are connected to either the sense node bSN or SN, capacitance of the sense nodes bSN and SN becomes large. Therefore, when the bit lines BLLj and bBLLj correspond to unselected columns, amplification of a signal difference between the memory cells MC0 and MC1 takes time. Accordingly, from the viewpoint of a signal amplification time, the mode shown in FIG. 5 is more preferable to that shown in FIG. 8. From the viewpoint of facilitation of a wiring layout as well, the mode shown in FIG. 5 is more preferable to that shown in FIG. 8.

Further, until t2, when the initial sense operation in the unselected columns is completed, the potential of the sense node pair SN and bSN is set to a potential lower than that of the source potential (VSS+Vthn). In the configuration shown in FIG. 5, the gates of the P-type transistors TP3 and TP4 receive the low potential of the sense node pair SN and bSN.

In this case, the bit line pair BL and bBL is precharged to VSL. Therefore, the transistors TP3 and TP4 have a possibility of being not completely set to an off state in the unselected columns. A potential (e.g. VSS) of the feedback line FBLp is transmitted by some extent to the bit lines BL and bBL, and can prevent the initial sense operation in the unselected columns.

On the other hand, in the configuration shown in FIG. 7, the gates of the N-type transistors TN3 and TN4 receive the low potential of the sense node pair SN and bSN. Therefore, even when the potential of the bit line pair BL and bBL are VSL, the transistors TN3 and TN4 become completely in an off state in the unselected columns. Accordingly, the sense amplifier S/A can accurately perform the initial sense operation without causing the potential of the feedback line bFBLn to prevent the initial sense operation in the unselected columns.

(Third Embodiment)

Figure 10:
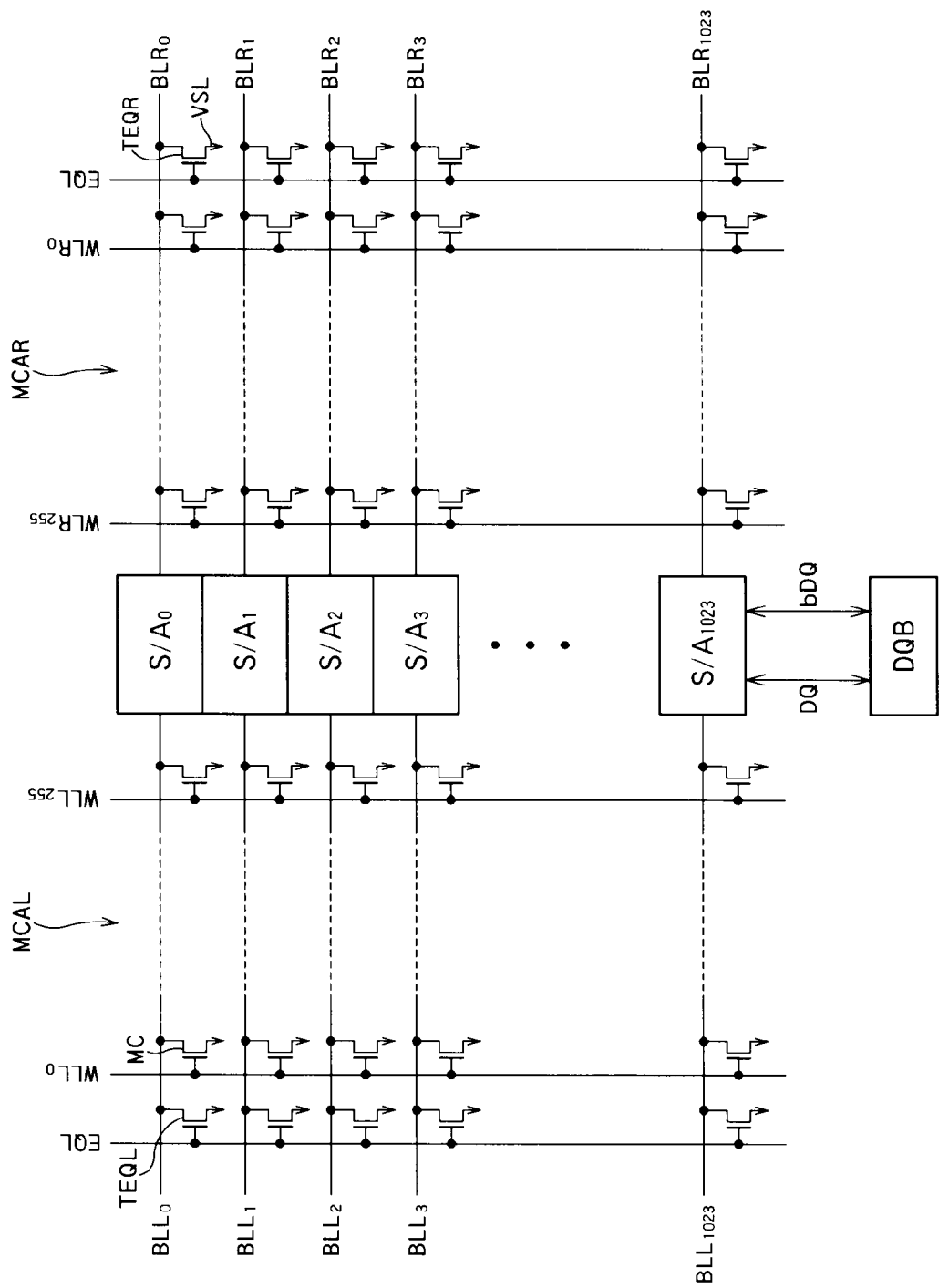
FIG. 10 shows one example of a configuration of an FBC memory device according to a third embodiment of the present invention.

FIG. 10 shows one example of a configuration of an FBC memory device according to a third embodiment of the present invention. The present FBC memory device operates in a scheme of 1 cell/bit.

The FBC memory device includes memory cells MCs, word lines WLL0 to WLL255, WLR0 to WLR255 (hereinafter, also called WLs), bit lines BLL0 to BLL1023, BLR0 to BLR1023 (hereinafter, also called BLs), sense amplifiers S/As. Althouth this memory device has an open bit-line architecture, a folded bit-line architecture can also be adopted.

The memory cells MCs are arranged two dimensionally in a matrix shape, thereby constituting memory cell arrays MCAL and MCAR (hereinafter, also called MCAs). The word lines WLs are extended to a row direction, and also function as gates (first gate electrodes) of the memory cells MCs. The bit lines BLs are extended to a column direction, and are connected to sources or drains of the memory cells MCs. The word lines WLs and the bit lines BLs are orthogonal to each other, and the memory cells MCs are provided at these intersections. These cells are called crosspoint type cells. The row direction and the column direction are called for the sake of convenience, and the row direction and the column direction can be replaced with each other.

In data read/write operations, one of a bit line pair BLL and BLR connected to both sides of each sense amplifier S/A transmits data of the memory cells MCs, and the other passes a reference current Iref. The reference current Iref is substantially an intermediate current between a current flowing to the "0" cells and a current flowing to the "1" cells. To generate the reference current Iref, dummy cells, dummy word lines, averaging circuits, and dummy writing circuits become necessary, but these are omitted here. Each sense amplifier S/A passes a current to the memory cells MCs via one of the bit lines BLs. With this arrangement, a current corresponding to the data of the memory cells MCs flows through a sense node within the sense amplifier S/A. The sense amplifier S/A identifies a logic value "1" or "0", based on whether the current flowing through the sense node is higher or lower than the reference current Iref. A system of storing one bit into one memory cell in this way is called a one-cell/bit (single cell) system.

EQL is an equalizing line to precharge the bit lines BL before read or write operations. TEQL and TEQR are equalizing transistors connecting the EQL to the bit lines BL during a precharge period.

Figure 11:
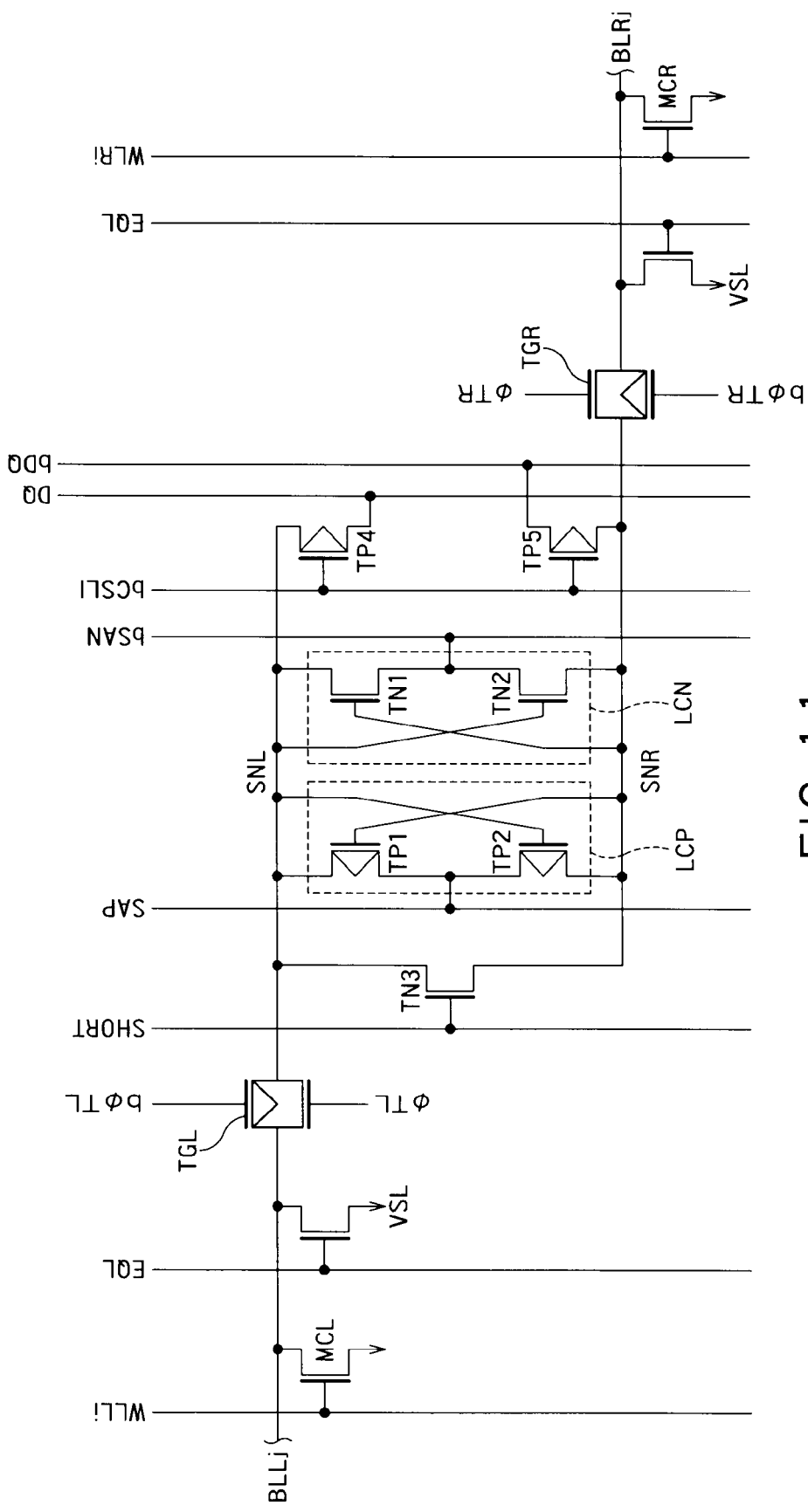
FIG. 11 is a circuit diagram showing a configuration of each of the sense amplifiers S/Aj.

FIG. 11 is a circuit diagram showing a configuration of each of the sense amplifiers S/Aj (j=0 to 1023). Each sense amplifier S/Aj (hereinafter, "S/A") is connected to one bit line BLLj (hereinafter, also "BLL") and one bit line BLRj (hereinafter, also "BLR") arranged on the left and right of the sense amplifier S/A, respectively, and provided to correspond to each bit line pair BLL and BLR. In this manner, the FBC memory device according to the first embodiment adopts an open bit line configuration. Therefore, during the data read operation, one of the paired bit lines BLL and BLR transmits data and the other bit line transmits a reference signal.

Each sense amplifier S/A includes a pair of sense nodes SNL and SNR. The sense node SNL is connected to one bit line BLL via a transfer gate TGL, and the sense node SNR is connected to a bit line BLR via a transfer gate TGR. The transfer gates TGL and TGR are controlled to be turned on or off by signals ΦTL, bΦTL and signals ΦTR, bΦTR.

Each sense amplifier S/A includes a cross-coupled dynamic latch circuits (hereinafter, "latch circuits") LCP and LCN. The latch circuit LCP is configured to include two p-type transistors TP1 and TP2 connected in series between the sense nodes SNL and SNR. A gate of the transistor TP1 is connected to the sense node SNR, and that of the transistor TP2 is connected to the sense node SNL. Namely, the gates of the transistors TP1 and TP2 are cross-coupled to the sense nodes SNL and SNR. The latch circuit RC2 is configured to include two n-type transistors TN1 and TN2 connected in series between the sense nodes SNL and SNR. A gate of the transistor TN1 is connected to the sense node SNR, and that of the transistor TN2 is connected to the sense node SNL. Namely, the gates of the transistors TN1 and TN2 are cross-coupled to the sense nodes SNL and SNR. The latch circuits LCP and LCN are driven by activating signals SAP and bSAN, respectively.

An n-type transistor TN3 is connected between the sense nodes SNL and SNR and controlled by a signal SHORT. The transistor TN3 equalizes the sense nodes SNL and SNR to each other by shorting these nodes before the data read or write operation. Alternatively, the n-type transistor TN3 can be replaced by an p-type transistor and an inverted signal bSHORT of the signal SHORT can be input to a gate of the p-type transistor.

p-type transistors TP4 and TP5 are connected between a DQ line and the sense node SN and between a bDQ line and the sense node bSN. Gates of the transistors TP4 and TP5 are connected to a column selection line CSLI (hereinafter, "CSL"). The DQ line and the bDQ line are connected to the DQ buffer DQB. The DQ buffer DQB is connected to an I/O circuit (not shown in figures). During the data read operation, the DQ buffer DQB temporarily stores therein data from the memory cells MCs to output the data to the outside. During the data write operation, the DQ buffer DQB temporarily stores therein data from the outside to transmit the data to the sense amplifiers S/As. Accordingly, the column selection line CSL is selectively activated when data is read to the outside or data is written from the outside, thereby making it possible to connect the sense nodes SNL and SNR to the DQ buffer DQB.

Figure 12:
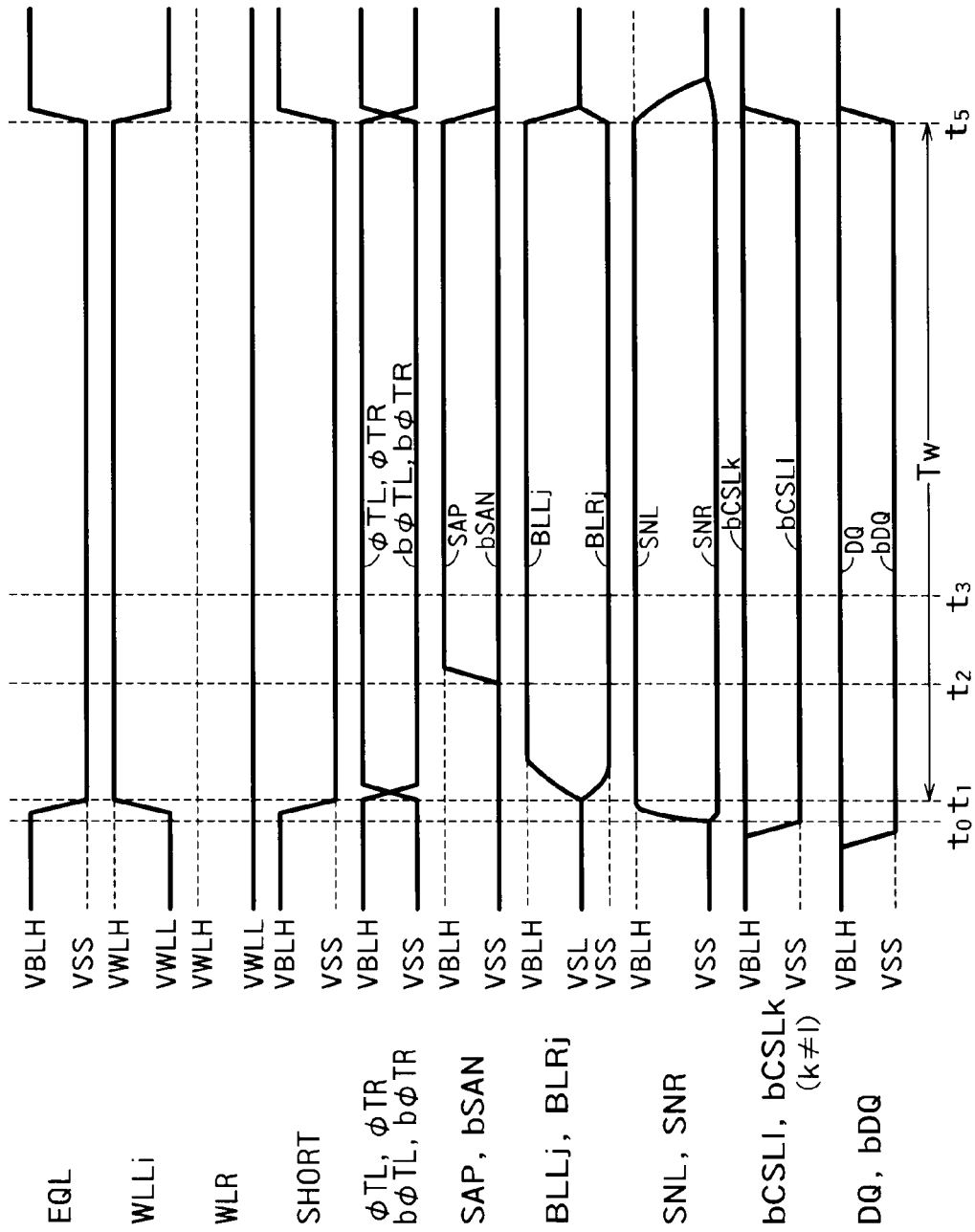
FIG. 12 is a timing diagram showing the data read operation performed by the FBC memory device according to the third embodiment.

FIG. 12 is a timing diagram showing the data read operation performed by the FBC memory device according to the third embodiment. In the third embodiment, the data read operation for causing the sense amplifiers S/As to receive a reference signal from the memory cell array MCAR and to detect data in the memory cell array MCAL will be described. Since the data read operation for causing the sense amplifiers S/As to detect data in the memory cell array MCAR is evident from that for detecting data in the memory cell array MCAL, it will not be described herein.

In FIG. 12, operations of EQL, a selected word line WLLi, SHORT, SAP, bSAN, BLLj, BLRj, SN, bSN, bCSLk, bCSLI, DQ and bDQ is same operations as those in FIG. 4. Therefore, it will not be described herein.

At t1, signals ΦTL, ΦTR, bΦTL, bΦTR are activated. Accordingly, the transfer gates TG1 and TG2 of all columns become a conductive state, and a pair of bit lines BLL and BLR of all columns are connected to a corresponding pair of sense nodes SNL and SNR, respectively. As a result, the bit lines BLLj and BLRj of the selected column to be written are connected to the sense nodes SNL and SNR, respectively. Bit lines of unselected columns not to be written are connected to corresponding sense nodes, respectively.

During t1 to t2, in unselected columns, a potential difference (a signal difference) between data "1" and "0" is generated in between the sense nodes SNL and SNR. FIG. 12 does not show a signal development of the sense node pair and the bit line pair of the unselected columns. The operation of the sense node pair and the bit line pair of the unselected columns before t3 is shown in the FIG. 9. At t2, when the signal difference is developed in a sufficiently large manner between the sense nodes SNL and SNR, the signal SAP rises to the high level potential VBLH, and the latch circuit LCP in FIG. 11 is activated. The potential VBLH is connected to the sense node SNL transmitting data "1", via the latch circuit LCP. Because the latch circuit LCN is always in an active state, the potential VSS is connected to the sense node SNR transmitting the reference data, via the latch circuit LCN. As a result, the sense amplifier S/A amplifies a signal difference to VBLH−VSS, and latches this signal difference to the sense nodes SNL and SNR.

On the other hand, in a selected column, during t1 to t2, as shown in the FIG. 12, the bit lines BLLj and BLRj are connected to the sense nodes SNL and SNR, respectively. Accordingly, after t1, as shown in FIG. 12, the potential of the sense node SNL is transmitted to the bit lines BLLj via the transfer gates TGL, respectively. That is, in the third embodiment, from the time when the transfer gates TGL and TGR are set to be a conductive state (after t1), the write data is started to be written into the memory cells MC of the selected column.

At t5, the data write cycle ends, and the FBC memory enters a precharge state.

According to the third embodiment, in an initial sense period (t1 to t2) when a sense amplifier S/A of unselected columns is detecting data, a sense amplifier S/A of a selected column has already started a data writing. Therefore, a write operation in the selected column is performed at a high speed. That is, the third embodiment can obtain the same advantages as those of the first embodiment, though the third embodiment has the 1 cell/bit structure.

(Fourth Embodiment)

Figure 13:
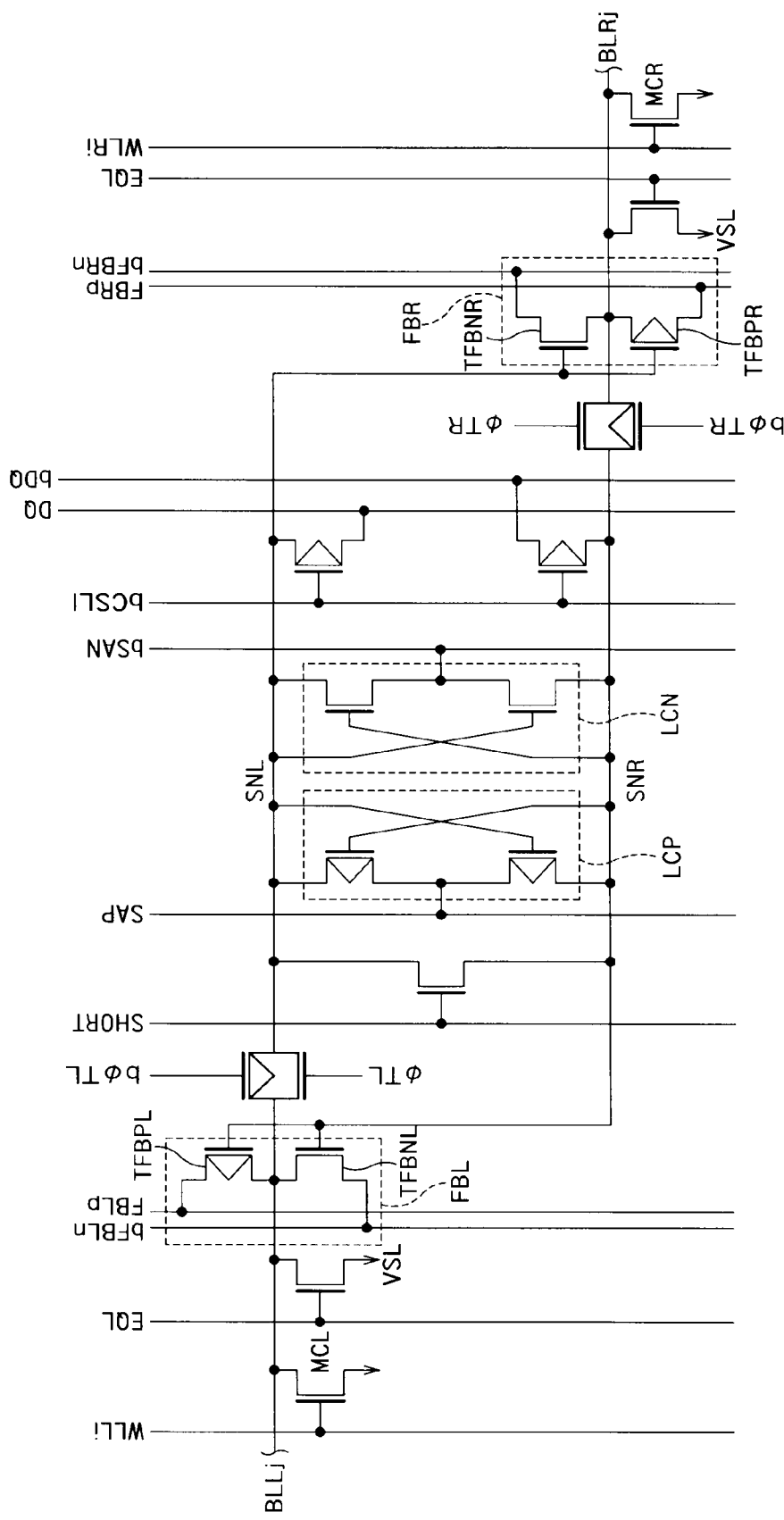
FIG. 13 is a circuit diagram showing a configuration of a sense amplifier S/A of an FBC memory according to a fourth embodiment of the present invention.

FIG. 13 is a circuit diagram showing a configuration of a sense amplifier S/A of an FBC memory according to a fourth embodiment of the present invention. The fourth embodiment is different from the third embodiment in that the FBC memory further includes feedback circuits FBL and FBR for writing. Other configurations of the fourth embodiment can be identical to those of the third embodiment.

The feedback circuits FBL and FBR are respectively connected between the bit line BLLj and the sense node SNR and between the bit line BLRj and the sense node SNL.

The feedback circuit FBL includes feedback transistors TFBPL and TFBNL connected in series each other. A node between the feedback transistors TFBPL and TFBNL is connected to the bit line BLLj. The feedback transistor TFBPL is connected between a signal line FBLp and the bit line BLLj. The feedback transistor TFBNL is connected between a signal line bFBLn and the bit line BLLj. Gates of the feedback transistors TFBPL and TFBNL are commonly connected to the sense node SNR.

The feedback circuit FBR includes feedback transistors TFBPR and TFBNR connected in series each other. A node between the feedback transistors TFBPR and TFBNR is connected to the bit line BLRj. The feedback transistor TFBPR is connected between a signal line FBRp and the bit line BLRj. The feedback transistor TFBNR is connected between a signal line bFBRn and the bit line BLRj. Gates of the feedback transistors TFBPR and TFBNR are commonly connected to the sense node SNL.

Figure 14:
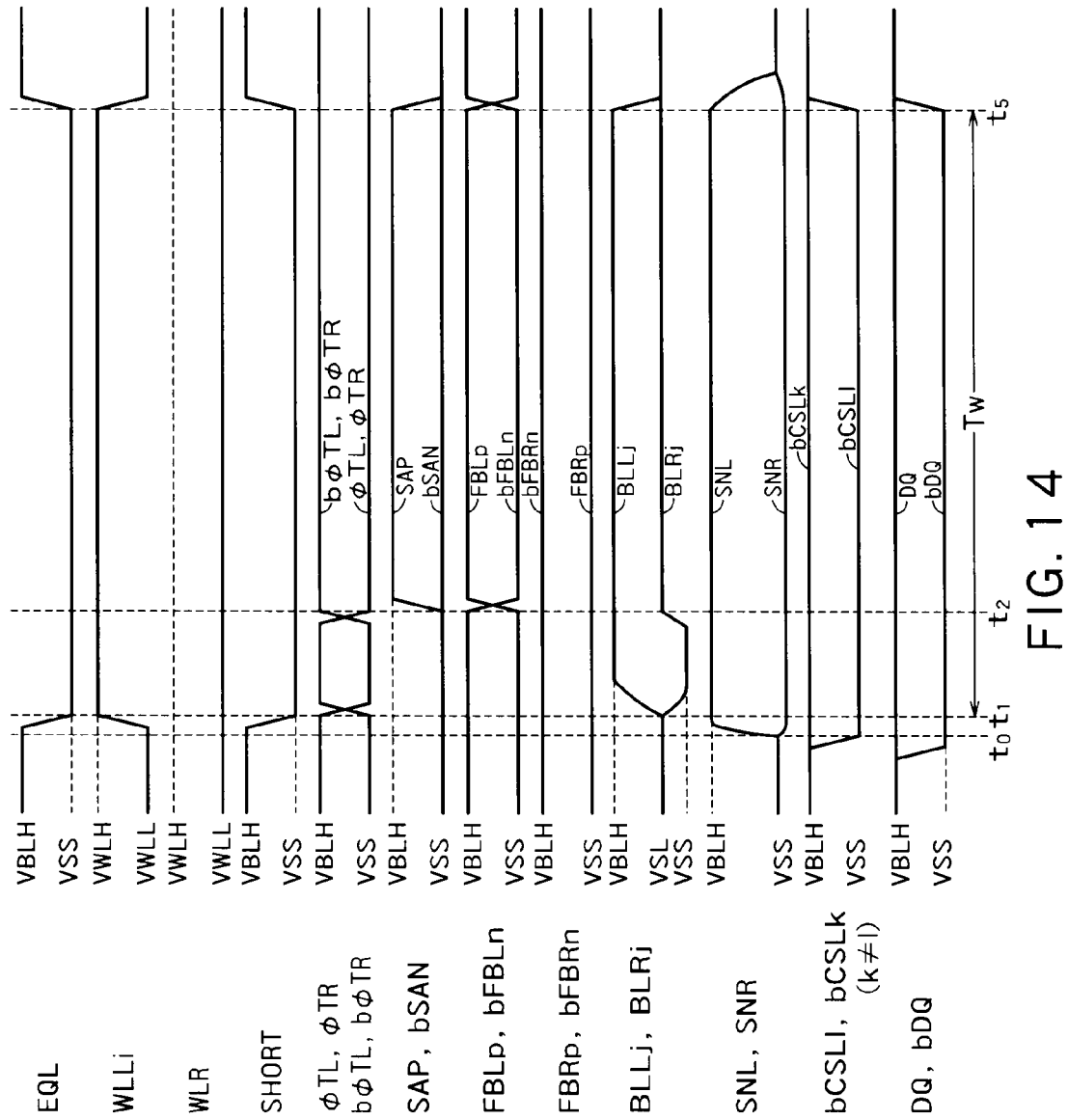
FIG. 14 is a timing diagram showing the data read operation performed by the FBC memory device according to the fourth embodiment.

FIG. 14 is a timing diagram showing the data read operation performed by the FBC memory device according to the fourth embodiment. In the fourth embodiment, the data read operation for causing the sense amplifiers S/As to receive a reference signal from the memory cell array MCAR and to detect data in the memory cell array MCAL will be described. Since the data read operation for causing the sense amplifiers S/As to detect data in the memory cell array MCAR is evident from that for detecting data in the memory cell array MCAL, it will not be described herein.

In FIG. 14, operations of EQL, a selected word line WLLi, SHORT, SAP, bSAN, BLLj, BLRj, SNL, SNR, bCSLk, bCSLl, DQ and bDQ is same operations as those in FIG. 4. Therefore, it will not be described herein.

At t1, signals ΦTL, ΦTR, bΦTL, bΦTR are activated. Accordingly, the transfer gates TG1 and TG2 of all columns become a conductive state, and a pair of bit lines BLL and BLR of all columns are connected to a corresponding pair of sense nodes SNL and SNR, respectively. As a result, the bit lines BLLj and BLRj of the selected column to be written are connected to the sense nodes SNL and SNR, respectively. Bit lines of unselected columns not to be written are connected to corresponding sense nodes, respectively.

During t1 to t2, the signal operations in unselected columns and a selected column are same as the signal operations in those of the third embodiment. Therefore, they will not be described herein.

In the fourth embodiment, same as the third embodiment, from the time when the transfer gates TGL and TGR are set to be a conductive state (after t1), the write data is started to be written into the memory cells MC of the selected column.

However, in the fourth embodiment, the transfer gates TGL and TGR are set to be a nonconductive state immediately before t2, Since the bit lines BLL and BLR are disconnected from the sense nodes SNL and SNR, the signal amplification is facilitated by decreasing the capacitance of the sense nodes in unselected columns.

At the t2, the feedback signal lines FBLp and bFBLn are activated. Therefore, the feedback circuit FBL connects the signal line FBLp or bFBLn to the bit line BLLj according to the potential level of the sense node SNL and SNR. As a result, the write operation to the selected memory cell is continued until t5.

At t5, the data write cycle ends, and the FBC memory enters a precharge state.

According to the fourth embodiment, in an initial sense period (t1 to t2) when a sense amplifier S/A of unselected columns is detecting data, a sense amplifier S/A of a selected column has already started a data writing. Further, during t2 to t5, the feedback circuits FBL or FBR write data to the selected memory cell. Therefore, a write operation in the selected column is performed at a high speed. That is, the fourth embodiment can also obtain the same advantages as those of the first embodiment, though the fourth embodiment has the 1 cell/bit structure. Moreover, the fourth embodiment also can obtain the same advantages as the second embodiment, since the feedback circuits FBL and FBR write data to the selected memory cell from t2 to t5 in the fourth embodiment.

In the third and the fourth embodiments, the bit line BLR flowing the reference current Iref during a read operation. During a write operation, however, bit line BLR does not flow the reference current Iref in a selected column in order to prevent a penetration current through the bit line BLR.

The invention claimed is:

1. A semiconductor memory device comprising:
a plurality of memory cells respectively comprising a body in an electrically floating state and configured to store data based on number of carriers within the body;
word lines configured to function as gates of the memory cells;
a first bit line and a second bit line configured to transmit data to the memory cells or from the memory cells;
a first sense node and a second sense node corresponding to the first bit line and the second bit line, respectively;
a first transfer gate connected between the first bit line and the first sense node;
a second transfer gate connected between the second bit line and the second sense node;
a latch circuit configured to latch data from the first bit line to the first sense node, and to latch data from the second bit line to the second sense node;
a first data line configured to read data latched to the first sense node to outside, or to transmit data from outside to the first sense node; and
a second data line configured to read data latched to the second sense node to outside, or to transmit data from outside to the second sense node, wherein
write data is transmitted from the first and second data lines to the first and second sense nodes corresponding to selected memory cells before the first and second transfer gates are set to be a conductive state, when writing data into the selected memory cells to be written out of the memory cells, and
write data in the first and second sense nodes corresponding to the selected memory cells are started to be written into the selected memory cells, when the first and second transfer gates are set to be a conductive state.

2. The device of claim 1, wherein data in unselected memory cells not to be written out of the memory cells is once read to the first and second sense nodes corresponding to the unselected memory cells, and the data in the unselected memory cells is written back to the same unselected memory cells, when the first and second transfer gates are set to be a conductive state, in a write operation of the data.

3. The device of claim 1, wherein
the memory cells are configured by N-type FETs,
the latch circuit comprises an N-type latch unit configured by a plurality of N-type FETs and configured to supply a low level potential lower than a source potential of the memory cells to either the first sense node or the second sense node, and a P-type latch unit configured by a plurality of P-type FETs and configured to supply a high level potential higher than the source potential to the other one of the first sense node or the second sense node, and
the N-type latch unit supplies the low level potential to the first or second sense node when reading data in the memory cells to the first and second sense nodes.

4. The device of claim 2, wherein
the memory cells are configured by N-type FETs,
the latch circuit comprises an N-type latch unit configured by a plurality of N-type FETs and configured to supply a low level potential lower than a source potential of the memory cells to either the first sense node or the second sense node, and a P-type latch unit configured by a plurality of P-type FETs and configured to supply a high level potential higher than the source potential to the other one of the first sense node or the second sense node, and
the N-type latch unit supplies the low level potential to the first or second sense node when reading data in the memory cells to the first and second sense nodes.

5. The device of claim 1, further comprising a feedback circuit connected between the first bit line and the second bit line, and configured to write data latched to the first and second sense node into the memory cells, wherein
write data in the first and second sense nodes corresponding to the selected memory cells is started to be written into the selected memory cells when the first and second transfer gates are set to be a conductive state, and
the feedback circuit writes write data in the first and second sense nodes corresponding to the selected memory cells into the selected memory cells when the first and second transfer gates are set to be a nonconductive state.

6. The device of claim 2, further comprising a feedback circuit connected between the first bit line and the second bit line, and configured to write data latched to the first and second sense node into the memory cells, wherein
write data in the first and second sense nodes corresponding to the selected memory cells is started to be written into the selected memory cells when the first and second transfer gates are set to be a conductive state, and
the feedback circuit writes write data in the first and second sense nodes corresponding to the selected memory cells into the selected memory cells when the first and second transfer gates are set to be a nonconductive state.

7. The device of claim 3, further comprising a feedback circuit connected between the first bit line and the second bit line, and configured to write data latched to the first and second sense node into the memory cells, wherein
write data in the first and second sense nodes corresponding to the selected memory cells is started to be written into the selected memory cells when the first and second transfer gates are set to be a conductive state, and
the feedback circuit writes write data in the first and second sense nodes corresponding to the selected memory cells into the selected memory cells when the first and second transfer gates are set to be a nonconductive state.

8. The device of claim 5, wherein the feedback circuit comprises an N-type feedback unit configured by a plurality of N-FETs and configured to supply a low level potential lower than a source potential of the memory cells to the first bit line or the second bit line, and a P-type feedback unit configured by a plurality of P-FETs and configured to supply a high level potential higher than the source potential to the other one of the first bit line or the second bit line.

9. The device of claim 6, wherein the feedback circuit comprises an N-type feedback unit configured by a plurality of N-FETs and configured to supply a low level potential lower than a source potential of the memory cells to the first bit line or the second bit line, and a P-type feedback unit configured by a plurality of P-FETs and configured to supply a high level potential higher than the source potential to the other one of the first bit line or the second bit line.

10. The device of claim 7, wherein the feedback circuit comprises an N-type feedback unit configured by a plurality of N-FETs and configured to supply a low level potential lower than a source potential of the memory cells to the first bit line or the second bit line, and a P-type feedback unit configured by a plurality of P-FETs and configured to supply a high level potential higher than the source potential to the other one of the first bit line or the second bit line.

11. The device of claim 3, wherein
two of the N-type FETs are connected in series between the first bit line and the second bit line,
a gate of the N-type FET connected to the first bit line is connected to the second bit line,
a gate of the N-type FET connected to the second bit line is connected to the first bit line,
two of the P-type FETs are connected in series between the first bit line and the second bit line,
a gate of the P-type FET connected to the first bit line is connected to the second sense node, and
a gate of the P-type FET connected to the second bit line is connected to the first sense node.

12. The device of claim 8, wherein
two of the N-type FETs are connected in series between the first bit line and the second bit line,
a gate of the N-type FET connected to the first bit line is connected to the second bit line,
a gate of the N-type FET connected to the second bit line is connected to the first bit line,
two of the P-type FETs are connected in series between the first bit line and the second bit line,
a gate of the P-type FET connected to the first bit line is connected to the second sense node, and
a gate of the P-type FET connected to the second bit line is connected to the first sense node.

13. The device of claim 3, wherein
two of the N-type FETs are connected in series between the first bit line and the second bit line,
a gate of the N-type FET connected to the first bit line is connected to the second sense node,
a gate of the N-type FET connected to the second bit line is connected to the first sense node,
two of the P-type FETs are connected in series between the first bit line and the second bit line,
a gate of the P-type FET connected to the first bit line is connected to the second bit line, and
a gate of the P-type FET connected to the second bit line is connected to the first bit line.

14. The device of claim 8, wherein
two of the N-type FETs are connected in series between the first bit line and the second bit line,
a gate of the N-type FET connected to the first bit line is connected to the second sense node,
a gate of the N-type FET connected to the second bit line is connected to the first sense node,
two of the P-type FETs are connected in series between the first bit line and the second bit line,
a gate of the P-type FET connected to the first bit line is connected to the second bit line, and
a gate of the P-type FET connected to the second bit line is connected to the first bit line.

15. The device of claim 3, wherein
two of the N-type FETs are connected in series between the first bit line and the second bit line,
a gate of the N-type FET connected to the first bit line is connected to the second sense node,
a gate of the N-type FET connected to the second bit line is connected to the first sense node,
two of the P-type FETs are connected in series between the first bit line and the second bit line,
a gate of the P-type FET connected to the first bit line is connected to the second sense node, and
a gate of the P-type FET connected to the second bit line is connected to the first sense node.

16. The device of claim 8, wherein
two of the N-type FETs are connected in series between the first bit line and the second bit line,
a gate of the N-type FET connected to the first bit line is connected to the second sense node,
a gate of the N-type FET connected to the second bit line is connected to the first sense node,
two of the P-type FETs are connected in series between the first bit line and the second bit line,
a gate of the P-type FET connected to the first bit line is connected to the second sense node, and
a gate of the P-type FET connected to the second bit line is connected to the first sense node.

17. A driving method of a semiconductor device, the semiconductor device comprising a plurality of memory cells respectively comprising a body in an electrically floating state and configured to store data based on number of carriers within the body, a first bit line and a second bit line connected to the memory cells, a first sense node and a second sense node corresponding to the first and second bit lines, respectively, a first transfer gate connected between the first bit line and the first sense node, and a second transfer gate connected between the second bit line and the second sense node, wherein
write data is transmitted from the first and second data lines to the first and second sense nodes corresponding to selected memory cells before the first and second transfer gates are set to be a conductive state, when writing data into the selected memory cells to be written out of the memory cells, and
write data in the first and second sense nodes corresponding to the selected memory cells are started to be written into the selected memory cells, when the first and second transfer gates are set to be a conductive state.

18. The method of claim 17, wherein
the semiconductor memory device comprises a feedback circuit connected between the first bit line and the second bit line, and
after write data in the first and second sense nodes corresponding to the selected memory cells is started to be written into the selected memory cells by setting the first and second transfer gates to be a conductive state,
the feedback circuit writes write data in the first and second sense nodes corresponding to the selected memory cells into the selected memory cells when the first and second transfer gates are set to be a nonconductive state.

19. A semiconductor memory device comprising:
a plurality of memory cells respectively comprising a body in an electrically floating state and configured to store data based on number of carriers within the body;
word lines configured to function as gates of the memory cells;
a first bit line and a second bit line configured to transmit data to the memory cells or from the memory cells;
a first sense node and a second sense node corresponding to the first bit line and the second bit line, respectively;
a first transfer gate connected between the first bit line and the first sense node;
a second transfer gate connected between the second bit line and the second sense node;
a latch circuit configured to latch data from the first bit line to the first sense node, and to latch data from the second bit line to the second sense node;

a first data line configured to read data latched to the first sense node to outside, or to transmit data from outside to the first sense node; and a second data line configured to read data latched to the second sense node to outside, or to transmit data from outside to the second sense node, wherein the first bit line transfers an information data from the selected memory cells, the second bit line transfers a reference data used for detecting logic of the information data, the latch circuit latches the information data to the first sense node and latches an opposite logic data of the information data to the second sense node, write data is transmitted from the first and second data lines to the first and second sense nodes corresponding to a selected memory cell before the first and second transfer gates are set to be a conductive state, when writing data into a selected memory cell to be written out of the memory cell, and write data in the first sense node corresponding to the selected memory cell is started to be written into the selected memory cell, when the first transfer gate is set to be a conductive state.

20. The device of claim 1 further comprising:

a first feedback circuit and a second feedback circuit writing data to the memory cells based on data latched to the first and the second sense nodes, wherein write data in the first and second sense nodes corresponding to the selected memory cell is started to be written into the selected memory cell when the first transfer gate is set to be a conductive state, and the first feedback circuit writes write data into the selected memory cell based on data latched to the second sense node when the first transfer gate is set to be a nonconductive state.

* * * * *